US010903104B2

(12) United States Patent
Pietrantonio et al.

(10) Patent No.: US 10,903,104 B2
(45) Date of Patent: *Jan. 26, 2021

(54) DUAL SCARA ARM

(71) Applicant: Brooks Automation, Inc., Chelmsford, MA (US)

(72) Inventors: Antonio F. Pietrantonio, Derry, NH (US); Anthony Chesna, Saugus, MA (US); Hakan Elmali, Groton, MA (US); Ulysses Gilchrist, San Jose, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/201,899

(22) Filed: Nov. 27, 2018

(65) Prior Publication Data
US 2019/0096726 A1   Mar. 28, 2019

Related U.S. Application Data

(60) Division of application No. 14/868,689, filed on Sep. 29, 2015, now Pat. No. 10,141,214, which is a
(Continued)

(51) Int. Cl.
| | |
|---|---|
| *H01L 21/67* | (2006.01) |
| *H01L 21/677* | (2006.01) |
| *B25J 9/04* | (2006.01) |
| *H01L 21/687* | (2006.01) |
| *B25J 18/00* | (2006.01) |

(52) U.S. Cl.
CPC ........ *H01L 21/67742* (2013.01); *B25J 9/042* (2013.01); *B25J 9/043* (2013.01); *B25J 18/00* (2013.01); *H01L 21/677* (2013.01); *H01L 21/68707* (2013.01); *Y10S 901/15* (2013.01); *Y10S 901/27* (2013.01); *Y10T 74/20305* (2015.01)

(58) Field of Classification Search
None
See application file for complete search history.

(56) References Cited

U.S. PATENT DOCUMENTS

| | | |
|---|---|---|
| 3,411,644 A | 11/1968 | Cook |
| 3,465,904 A | 9/1969 | Pensa |
| | (Continued) | |

FOREIGN PATENT DOCUMENTS

| | | |
|---|---|---|
| JP | 10163296 | 6/1998 |
| JP | 11284049 | 10/1999 |

OTHER PUBLICATIONS

International Search Report, International Application No. PCT/US2005/020304, dated Feb. 1, 2007.

*Primary Examiner* — Ronald P Jarrett
(74) *Attorney, Agent, or Firm* — Perman & Green, LLP; Colin C. Durham

(57) ABSTRACT

A substrate transport apparatus having a drive section and a scara arm operably connected to the drive section to move the scara arm. The scara arm has an upper arm and at least one forearm. The forearm is movably mounted to the upper arm and capable of holding a substrate thereon. The upper arm is substantially rigid and is adjustable for changing a predetermined dimension of the upper arm.

18 Claims, 12 Drawing Sheets

Related U.S. Application Data continuation of application No. 13/768,495, filed on Feb. 15, 2013, now Pat. No. 9,147,590, which is a division of application No. 11/148,871, filed on Jun. 9, 2005, now Pat. No. 8,376,685.

(60) Provisional application No. 60/578,571, filed on Jun. 9, 2004.

(56) References Cited

U.S. PATENT DOCUMENTS

| | | |
|---|---|---|
| 3,550,800 A | 12/1970 | Robinson |
| 3,648,866 A | 3/1972 | Slown |
| 3,732,998 A | 5/1973 | Martin |
| 3,734,321 A | 5/1973 | Long et al. |
| 3,840,133 A | 10/1974 | Berg |
| 3,843,002 A | 10/1974 | Pihlgren |
| 3,871,540 A | 3/1975 | Jenkins |
| 3,877,594 A | 4/1975 | Coakley |
| 3,972,433 A | 8/1976 | Reed |
| 4,212,580 A | 7/1980 | Fluck |
| 4,239,438 A | 12/1980 | Everson |
| 4,274,788 A | 6/1981 | Sutton |
| 4,420,165 A | 12/1983 | Goodin |
| 4,983,206 A | 1/1991 | Trunzo |
| 5,069,595 A | 12/1991 | Smith et al. |
| 5,108,248 A | 4/1992 | Murrill |
| 5,123,799 A | 6/1992 | Breazeale |
| 5,447,408 A | 9/1995 | Smith |
| 5,511,928 A | 4/1996 | Ellis |
| 5,513,946 A | 5/1996 | Sawada et al. |
| 5,609,462 A | 3/1997 | Reimer |
| 5,921,741 A | 7/1999 | Heimgartner |
| 6,034,000 A | 3/2000 | Heyder et al. |
| 6,056,504 A | 5/2000 | Hudgens et al. |
| 6,105,454 A | 8/2000 | Bacchi et al. |
| 6,155,768 A | 12/2000 | Bacchi et al. |
| 6,205,368 B1 * | 3/2001 | Hirahara ............... B25J 9/1679 414/935 |
| 6,234,738 B1 | 5/2001 | Kimata et al. |
| 6,485,250 B2 | 11/2002 | Hofmeister |
| 6,669,434 B2 | 12/2003 | Namba et al. |
| 8,376,685 B2 | 2/2013 | Pietrantonio et al. |
| 9,147,590 B2 | 9/2015 | Pietrantonio et al. |
| 2002/0098072 A1 | 7/2002 | Sundar |
| 2003/0086778 A1 | 5/2003 | Smith |

* cited by examiner

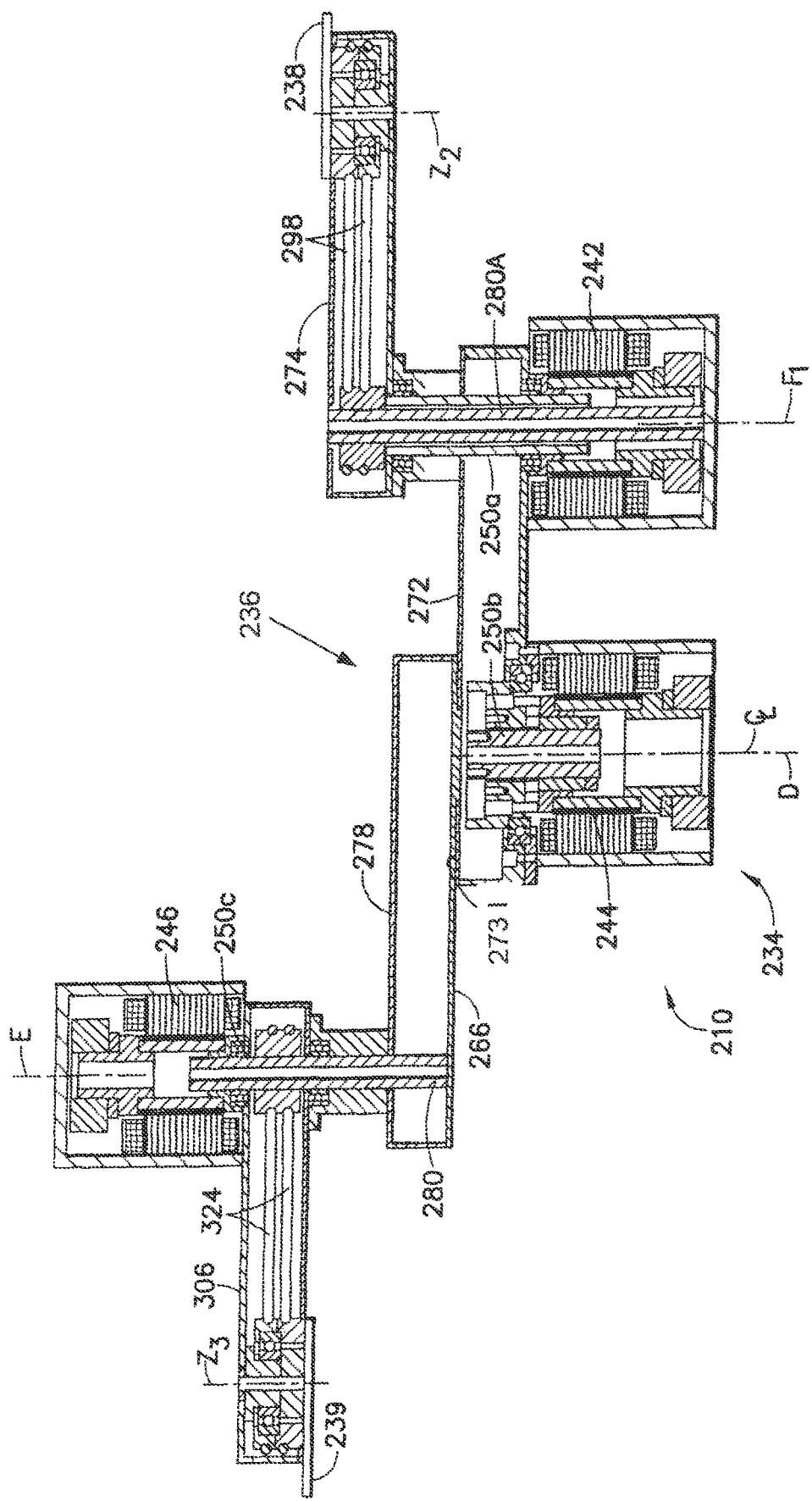

DUAL SCARA ARM

CROSS-REFERENCE TO RELATED APPLICATION

The present application is a Divisional Application of U.S. patent application Ser. No. 14/868,689, filed on Sep. 29, 2015, (now U.S. Pat. No. 10,141,214), which application is a continuation of U.S. patent application Ser. No. 13/768,495, filed Feb. 15, 2013 (now U.S. Pat. No. 9,147,590) which is a divisional of U.S. patent application Ser. No. 11/148,871, filed Jun. 9, 2005 (now U.S. Pat. No. 8,376,685) and claims the benefit of U.S. Provisional Application No. 60/578,571, filed Jun. 9, 2004 which are incorporated by reference herein in their entireties.

BACKGROUND

1. Field of the Invention

The present invention relates to a substrate transport apparatus.

2. Brief Description of Related Developments

The continuous demand by consumers for ever cheaper electronic devices has maintained pressure on manufacturers of the device to improve efficiency. Indeed, in the current market place, many of the devices, and to a much greater extent in the electronic and semiconductor components, used in the devices, have become commodities. The desire of manufacturers of electronic and semiconductor device to increase efficiency manifests itself at all levels, but is of special significance in the design, construction, and operation of fabrication facilities or fabs. One unit by which to measure the efficiency of a given fab may be the throughput per unit of area (e.g. throughput per FT2). As may be realized from this unit of measure, the fab efficiency may be increased by raising the production rate per. fabrication tool or work station of given size (space/footprint envelope), or reducing the size of the work station used to generate a greater work station density within the fab. Thus, numerous efforts have been made to increase production rates. A number of these efforts have involved providing transport apparatus capable of providing faster swap times (i.e. the time period involved in removing a workpiece from a processing module and replacing it with a new workpiece). Other efforts have been directed at reducing the overall footprint of the fabrication tool. As may be realized, there are constraints that operate against, these efforts to improve fab efficiency that intrinsically arise from the fabrication system itself. For instance, fabricators currently favor fabrication system configurations for batch processing of 200 mm and 30 mm wafers that employ a general radial tool layout. This in turn defines this extension of the transport apparatus, to transport wafers to the different tool modules, which in turn impacts the overall footprint of the transport apparatus. As may be realized, in conventional transport apparatus, the longer the reach, the larger the footprint (e.g. longer links on transport elements are used to accommodate a longer reach). An example of a conventional transport apparatus is described in U.S. Pat. No. 6,669,434. This conventional apparatus is a double arm substrate transport unit that has a base arm and first and second forearms supported from the same end/tip of the base arm. Though providing a fairly compact overall footprint, this conventional transport apparatus suffers longer swap, times due in part, to the dynamic effects of mounting both forearms on one end of the base arm (e.g. increased polar moment of inertia, substrate transport speed during extension/retraction of arm at snap out does not have benefit or base arm motion). The present invention as incorporated in the exemplary embodiments overcomes the problems of the conventional transport apparatus as will be described in greater detail below.

SUMMARY OF THE INVENTION

In accordance with one exemplary embodiment, a substrate transport apparatus is provided. The apparatus comprises a drive section, and a scara arm. The scara arm is operably connected to the drive section to move the scara arm. The scara arm comprises an upper arm and at least one forearm movably mounted on the upper arm and capable of holding a substrate thereon. The upper arm is a substantially rigid link that is adjustable for changing a predetermined dimension of the upper arm.

In accordance with another exemplary embodiment, a substrate transport apparatus is provided. The apparatus comprises a drive section and a scara arm. The scara arm is operably connected to the drive section to move the scara arm. The scara arm has an upper arm and at least one forearm. The forearm is movably mounted on the upper arm and capable of holding a substrate thereon. The upper arm is substantially rigid having a first substantially rigid arm section releasably attached to a second substantially rigid arm section. When released the first arm section is movable relative to the second arm section for changing a predetermined dimension of the upper arm.

In accordance with yet another exemplary embodiment, a substrate transport apparatus is provided. The apparatus comprises a drive section and a scara arm. The scara arm is movably connected, to the drive section. The scara arm comprises an upper arm, a first forearm, and a second forearm. The upper arm is pivotably joined to the drive section to rotate about a first axis of rotation relative to the drive section. The upper arm is an elongated linear member terminating at opposite ends. The upper arm is located relative to the drive section so that the first axis of rotation is at one end of the opposite ends of the upper arm. The first forearm has a first end effector depending therefrom. The first forearm is pivotably joined to the upper arm at another end of the opposite ends of the upper arm. The joint between the first forearm and the upper arm defines a first elbow joint of the scara arm. The second forearm has a second end effector depending therefrom. The second forearm is pivotally joined to the upper arm at the other end of the opposite ends of the upper arm. The joint between the second forearm and the upper arm defines a second elbow joint of the scara arm. The first elbow joint and the second elbow joint are independent of each other.

BRIEF DESCRIPTION OF THE DRAWINGS

The foregoing aspects and other features of the present invention are explained in the following description, taken in connection with the accompanying drawings, wherein:

FIG. 7 is a schematic cross-section view of a substrate transport apparatus in accordance with another exemplary embodiment;

DETAILED DESCRIPTION OF THE EXEMPLARY EMBODIMENT(S)

Figure 1:
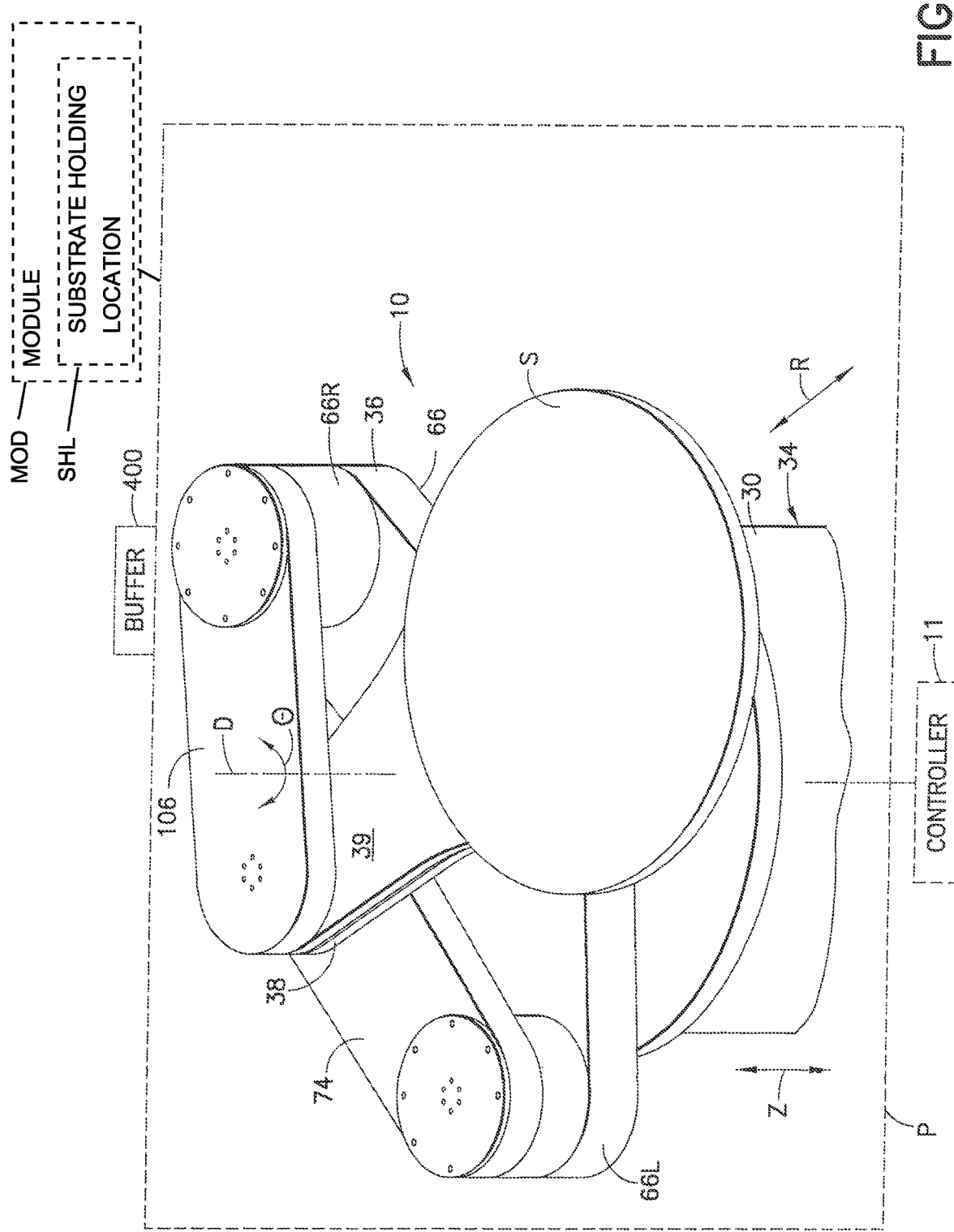
FIG. 1 is a schematic perspective view of a substrate transport apparatus incorporating features of the present invention in accordance with an exemplary embodiment.

Referring to FIG. 1, a perspective view is provided of a substrate transport apparatus 10 incorporating features of the present invention, in accordance with one exemplary embodiment. Although the present invention will be described with reference to the embodiment shown in the drawings, it should be understood that the present invention can be embodied in many alternate forms of embodiments. In addition, any suitable size, shape or type of elements or materials could be used.

In FIG. 1, the substrate transport apparatus 10 is shown being used to transport semiconductor wafers S, such as 200 mm or 300 mm wafers, for example purposes. The transport apparatus, in accordance with the exemplary embodiments described herein, however may be suitably configured to handle any desired flat workpiece items including the 200 mm or 300 mm semiconductor wafers (already mentioned), semiconductor packaging substrates (such as high density interconnects HOI), semiconductor processing imaging plates (e.g. masks or reticles) and substrates for flat panel displays. The apparatus 10 is also shown in FIG. 1 as being located within a generally illustrated transport chamber P (schematically shown in phantom) of a processing or workstation (not shown). As may be realized the transport chamber P provides a free/open space envelope in which the apparatus 10 can be articulated to transport the substrates S between an origin and a destination. The size of the transport chamber is dependent, at least in any part, on the footprint of the transport apparatus, and apparatus 10 in accordance with the features of the exemplary embodiment allows the size of the chamber P to be minimized for a given reach of the transport apparatus as will be described further below. The transport chamber P in this embodiment may be located in an environmental portion of a workstation, or may be part of the atmospherically controlled or isolated section of the workstation. For example, the transport chamber P may be part of the environmental front end module of a workstation. In that case, the transport apparatus 10 may be used for moving substrates S through the transport chamber from loading station (e.g. a load port) (not shown) to a load lock, or processing module (not shown) and vice versa. In the case where the transport chamber P is located within the atmospherically controlled section of a workstation, the transport apparatus 10 may be used to transfer substrates between the load locks (isolating the controlled atmosphere in the atmospherically controlled section from the environmental section or other atmospherically controlled sections with different atmosphere) and substrate processing chambers (not shown) such as material deposition, etching, masking, lithography, heating chambers for example. The apparatus 10 in accordance with the exemplary embodiments described herein, operates equally well whether in an environmental transport chamber or atmospherically controlled (e.g. vacuum, inert gas, N2) chamber. The transport apparatus 10 may be fixed in the chamber P or may be mounted on a movable car or shuttle (not shown) such as the example described in U.S. Pat. No. 6,139,245, which is incorporated by reference herein in its entirety.

Still referring to FIG. 1, the substrate transport apparatus 10 generally comprises a drive section 30 and a movable arm assembly 36. The arm assembly 36 has, what shall be referred to generally, as a butterfly scara arm arrangement terminating in two end effectors 38, 39. The arm assembly 36 includes an upper or base arm 66, and two forearms 74, 106 depending from opposite ends 66R, 66L of the upper arm. The arm assembly 36 is connected to the drive section 30, at shoulder joint 35, (see FIG. 2), to rotate (in the direction indicted by arrow θ in FIG. 1) and extend/retract (in the direction indicated by arrow R) the end effectors 38, 39 on the arm assembly in order to position substrates into or pick substrates from a substrate holding location SHL of any desired module MOD (see FIG. 1) having any desired position on the chamber P. The upper arm 66 is adjustable to provide the transport apparatus 10 with a minimum footprint while maintaining the end effectors 38, 39 in an optimum position (to reduce swap times) as will be described in general detail below.

Figure 2:
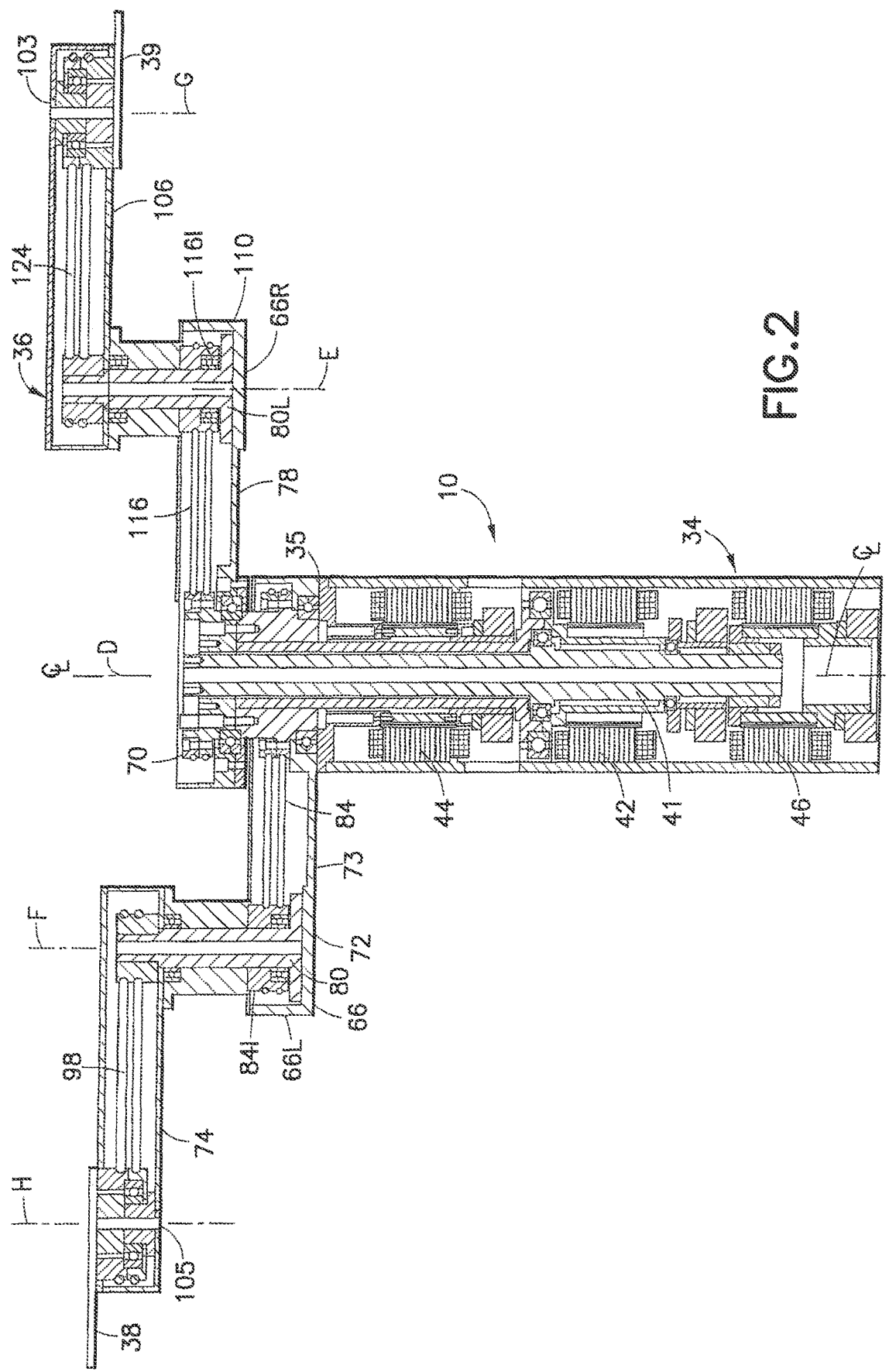
FIG. 2 is a cross-section view of the substrate transport apparatus in FIG. 1.
Figure 3:
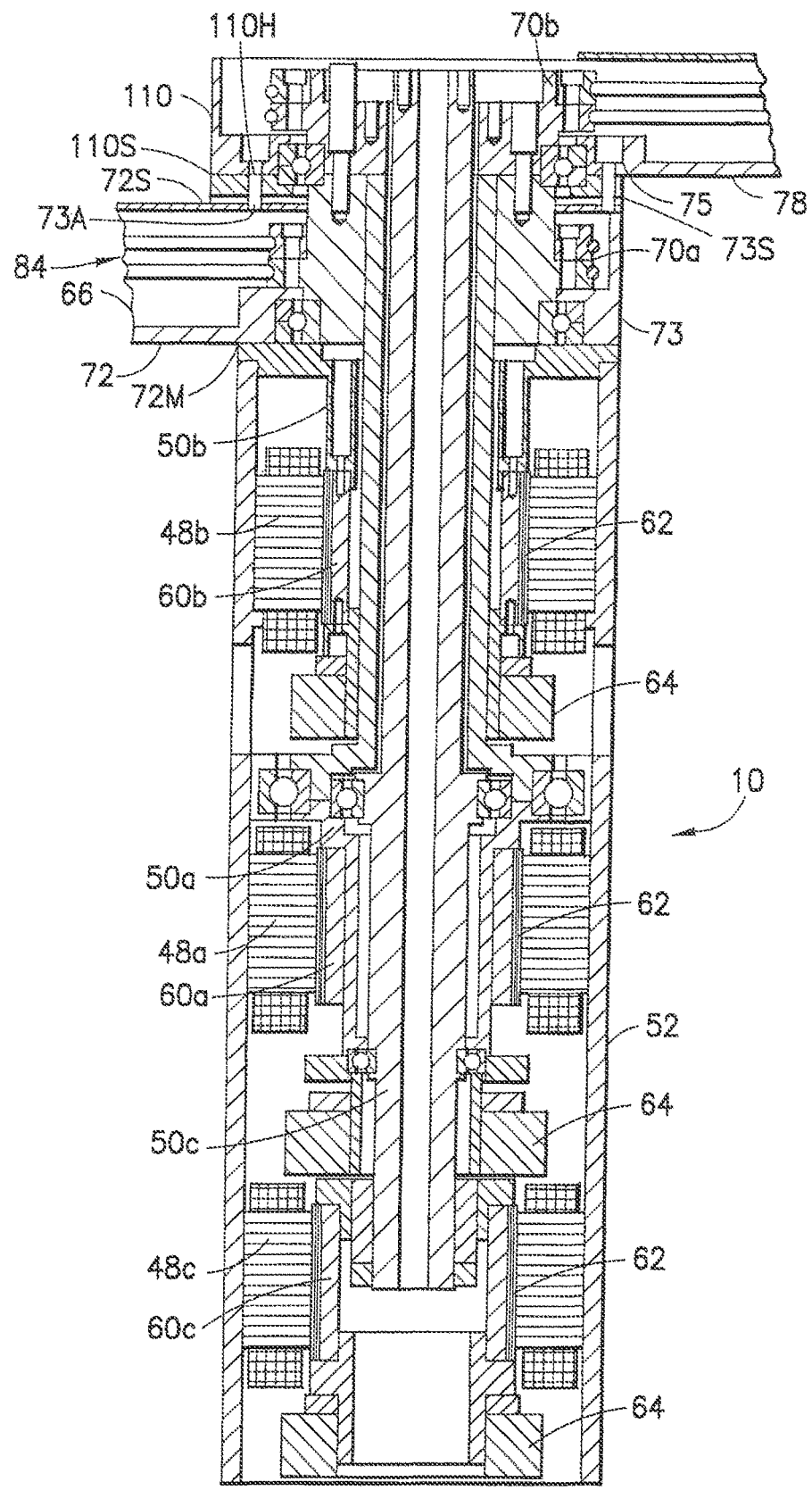
FIG. 3 is an enlarged partial cross-section view of a drive section of the transport apparatus in FIG. 1.

Referring now also to FIGS. 2 and 3, respectively showing a cross sectional view and an enlarged, partial cross sectional view of the apparatus 10, the drive section 30 may include a vertical drive (not shown) and a rotational drive 34. The vertical drive is capable of raising and lowering the apparatus 10 along the vertical axis Z (see FIG. 1). Any suitable type of vertical movement system may be used. A suitable example is disclosed in U.S. Pat. No. 5,894,760, which is incorporated by reference herein in its entirety. In alternate embodiments, the drive section of the transport apparatus may not have a vertical drive. In the embodiment shown in FIGS. 2-3, the rotational drive 34 has motors for independently moving the upper arm 66 and each of the forearms 74, 106. In alternate embodiments, the rotational drive may have more or fewer motors. In this embodiment, the rotational drive 34 is located at the shoulder or base joint 35 where the upper arm 66 is pivotally connected to the frame casing of the drive section. In alternate embodiments, the rotational drive may be located at any other suitable location. The rotational drive 34 generally comprises a drive shaft assembly 41 and three motors 42, 44, 46. In an alternate embodiment the drive could have more than three motors. The drive shaft assembly 41 has three drive shafts 50a, 50b, 50c. In an alternate embodiment more than three drive shafts could be provided. The first motor comprises a stator 48a and a rotor 60a connected to the middle shaft 50a. The second motor 44 comprises a stator 48b and a rotor 60b connected to the outer shaft 50b. The third motor 46 comprises a stator 48c and rotor 60c connected to the inner shaft 50c. The three stators 48a, 48b, 48c are stationarily attached to the tube 52 at different vertical heights or locations along the tube. In this embodiment the first stator 48a is the middle stator, the second stator 48b is the top stator and the third stator 48c is the bottom stator. Each stator generally comprises an electromagnetic coil. The three shafts 50a, 50b, and 50c are arranged as coaxial shafts about common axis of rotation D at the shoulder joint 35 of the apparatus. The three rotors 60a, 60b, 60c may be comprised of permanent magnets, but may alternatively comprise a magnetic induction rotor which does not have permanent magnets. Sleeves 62 may be located between the rotor 60 and the stators 48 to allow the robot 24 to be useable in a vacuum environment with the drive shaft assembly 41 being located in a vacuum environment and the stators 48 being located outside of the vacuum environment. However, the sleeves 62 need not be provided if the robot 24 is only intended for use in an atmospheric environment.

The third shaft 50c is the inner shaft and extends from the bottom stator 48c. The inner shaft has the third rotor 60c aligned with the bottom stator 48c. The middle shaft 50a extends upward from the middle stator 48a. The middle shaft has the first rotor 60a aligned with the first stator 48a. The outer shaft 50b extends upward from the top stator 48b. The outer shaft has the second rotor 60b aligned with the upper stator 48b. Various bearings are provided about the shafts 50 and the tube 52 to allow each shaft to be independently rotatable relative to each other and the tube 52. In this embodiment each shaft 50 is provided with a position sensor 64. The position sensors 64 are used to signal the controller 11 (see FIG. 1) of the rotational position of the shafts 50 relative to each other and/or relative to the tube 52. Any suitable sensor could be used, such as optical or induction.

Referring still to FIGS. 2 and 3, the arm assembly 36, as noted before, generally comprises upper arm 66 and two forearms 74, 106, each carrying a corresponding end effector 38, for holding and transporting substrates S. As also noted before, the upper arm 66 is pivotally mounted to the frame of the rotational drive at shoulder joint 35 so that the arm 66 may pivot about common axis of rotation D at the shoulder as will be seen further below. Each forearm 74, 106 is pivotally mounted to the upper arm 66 at opposite ends of the arm. Hence, forearm 74 is pivotable relative to the upper arm about elbow joint axis of rotation F, and forearm 106 is pivotable relative to the upper arm about the axis of rotation E at the opposite elbow joint. As seen in FIG. 2, the arm assembly 36 also includes a number of transmission mechanisms connecting the drives of the rotational drive 34 to the forearms 74, 108 and the end effectors 38, 39 to the upper arm 66.

As seen best in FIG. 2, the upper arm 66 in this embodiment generally has two opposing arm sections 72, 78. The sections 72, 78 are joined to each other, in this embodiment at the shoulder joint 35 of the arm assembly. The sections 72, 78 are capable of being locked to each other, allowing the upper arm 66 to be rotated as a unit about shoulder axis of rotation O. The opposing sections 72, 78 may otherwise be unlocked in order to reposition the opposing sections relative to each other. In alternate embodiments, the upper arm may comprise any desired number of sections, or may be one piece with a lockable flexible joint to allow adjustable positioning of different parts of the section relative to each other. In this embodiment, the upper arm sections 72, 78 are generally similar to each other and hence will be described with reference specifically to section 72 except where different. Upper arm section 72 generally has a hollow frame or casing capable of housing the transmission 84 connecting the forearm 74 to the corresponding rotational drive (transmission 116 connects forearm 106 in arm section 79). One end 66 L of the upper arm section 72 defines an elbow joint of the arm assembly 34. A post 80 is fixed to the frame of arm section 72 at this end about which idler member (e.g. pulley) 84I of transmission 84 is rotatably mounted (similarly idler member 116I of transmission 116 is mounted to post 80L in the opposite arm section 78) to provide a motive means to the forearm 74. In this embodiment, the upper arm section 72 is fixedly attached to the outer shaft 50b of the rotational drive 34 (see FIG. 3). The opposing upper arm section 78 is also fixed to the outer shaft 50b, but in this embodiment, the section 78 is adjustably fixed to the outer shaft 50b by adjustable attachment or coupling to the upper arm section 72. As seen in FIG. 3, the upper arm section 72 includes a mounting surface 72M fastened (though fasteners are shown in this embodiment, engagement may be by any suitable torque transfer system) directly to the outer shaft 50b of the rotational drive. Upper arm section 72 also has a mounting section 72S to which the opposing upper arm section 78 may be adjustably attached as will be described in greater detail below.

As seen in FIGS. 2 and 3, in this embodiment the opposing sections 72, 78 of the upper arm assembly 66 are vertically offset. In alternate embodiments, the adjustably positionable section may be positioned in any desired configuration relative to each other, such as being at substantially the same vertical level. The mounting or coupling section 72S of main section 72 in this embodiment is formed by the frame 73 of the arm section. The frame 73 in this embodiment extends around the co-axial shaft assembly of the drive section to form a seating surface 73S for the opposing arm section 78. The surface 73S, which in this embodiment is generally in the same plane as the upper surface of the arm section 72, has locating features 73H for both vertical and horizontal positioning of the arm section 78 onto arm section 72. The opposing arm section 78 has a frame 110 that has a mating section 110S which is generally conformally configured, with respect to mounting section 72S so that mating section 110S may be mounted on the mounting section 72S. In this embodiment the locating features 73H are fastener holes formed in seating surface 73S. Similarly, the seating surface of the mating section 110S of the opposing upper arm section 78 also has fastener holes 110H. As will be described below, the fastener holes formed in the respective seating surfaces are distributed and spaces to provide desired indexing positions for indexing the arm section 72, 78 relative to each other. Fasteners 75, such as cap screws, bolts, locating pins, may be inserted through holes 110H of the upper arm section 78, into matching holes 73H of the other upper arm section 72 thereby locking the two arm sections 72, 78 of the upper arm to each other. The fasteners are sufficient for torque transfer during movement and hence the upper arm section 78 (which is noted before is not directly mounted to the outer shaft 50*b* of the rotational drive 34) rotates in unison with opposing arm section 72 when arm section 72 is rotated by outer shaft 50*b* about common axis of rotation D at the shoulder joint of the arm assembly. In alternate embodiments, any other suitable enablement features, such as splines, keys/keyways, may be used for locating and torque transfer between the opposing arm sections.

The locating holes 73H, 110H are circumferentially equally distributed on the respective frame 73, 110 of the upper arm section 72, 78. Any desired number of holes may be used to provide the desired incremental adjustment spacing between the upper arm section 72, 78 will be described below. The number of locating holes in the mounting sections 73S, 110S of the arm sections may be different, as one section 73S, 110S may include only the minimum number of holes for mechanical loads, while the mating section would have additional holes for desired positional adjustment or indexing. For example, if four fasteners 75 are used for mechanical attachment, then one mounting section 73S, 110S may have four mounting holes 73H, 110H and the other mounting section may have eight or ten or any desired number of holes to accommodate adjustment between the arm sections. The mating surfaces 73S, 110S may include additional engagement features, such as interlocking or interdigitated lips or edges (not shown) that stably hold the arm sections together when the locking fasteners 75 are removed. Accordingly, the upper arm sections 72, 78 may remain self supporting when the fasteners 75 are removed to effect positional adjustment as will be described below. The engagement features may be provided with suitable sliding surfaces (not shown) to allow sliding motion between arm sections when being positionally adjusted without generating particulate matter at the sliding surfaces. In this embodiment, the mounting sections 73S, 110S of the upper arm sections are shown as being disposed at the shoulder joint 35 (see FIG. 2) of the arm assembly. In alternate embodiments, the adjustable connection between the upper arm sections may be located at any other position along the upper arm.

Referring still to FIGS. 2 and 3, the transmission system 84 for forearm 74 is operably connected to middle shaft 50A of the rotational drive 34. The transmission system 116 for the forearm 106 is operably connected to the inner shaft 50C as shown for example in FIG. 3. Forearm transmission systems 84, 116 are generally similar, and are illustrated in this embodiment as being a belt and pulley system for example purposes. In alternate embodiments, the transmissions linking the forearms to the drives may be any other suitable transmission such as a crank and connecting link system, or a gear and screw type of transmission. In this embodiment, the transmission systems 84, 116 generally comprise drive pulleys 70A, 70B (respectively fixed to the center 50A, and inner 50C drive shafts). Idler pulley 84I, 116I are rotatably mounted on posts 80 in the elbows of the upper arm 66, and are connected by suitable belts to the drive pulleys. The frames of the forearms 74, 106, which are mounted with suitable bearings to rotate freely about posts 80, are fixedly joined to the corresponding idler pulleys. Hence, rotation of shaft 50*a* causes rotation of forearm 74 about axis of rotation F, and rotation of shaft 50C causes rotation of forearm 106 about axis E. The transmission systems 84, 116 may have any desired reduction ratios, and the embodiment shown in FIG. 2 has a 1:2 reduction for example purposes. As shown in FIG. 2, each forearm 74, 106 in this embodiment, encases a synchronizer system 98, 124 synchronizing the position of the respective end effectors 38, 39 to the upper arm 66. In the embodiment shown, the synchronizer systems 98, 124 are belt and pulley systems for example purposes, and any suitable synchronizer system may be used. The synchronizer systems include base pulleys fixed onto the posts 80 at the elbows of the upper arm (which as noted before are fixed to the respective frames) 73, 110 of the opposing sections of the upper arm as shown In FIG. 2. Idler pulleys are fixed to the end effectors, and are rotatably supported in the forearms so that the end effectors are free to rotate, relative to the forearms, about corresponding axis of rotation G, H (the axis of rotation at the wrist joints of the arm assembly). The reduction ratio of the synchronizer is shown for example purposes as being 2:1 though any suitable reduction may be used. As seen best in FIG. 1, the forearm 106 and end effector 39 mounted thereon, are set off sufficiently from the upper arm 66 to allow forearm 74, with end effector 38 thereon to move freely past forearm 106 when both end effectors are transporting substrates S (see FIG. 1).

Figure 4:
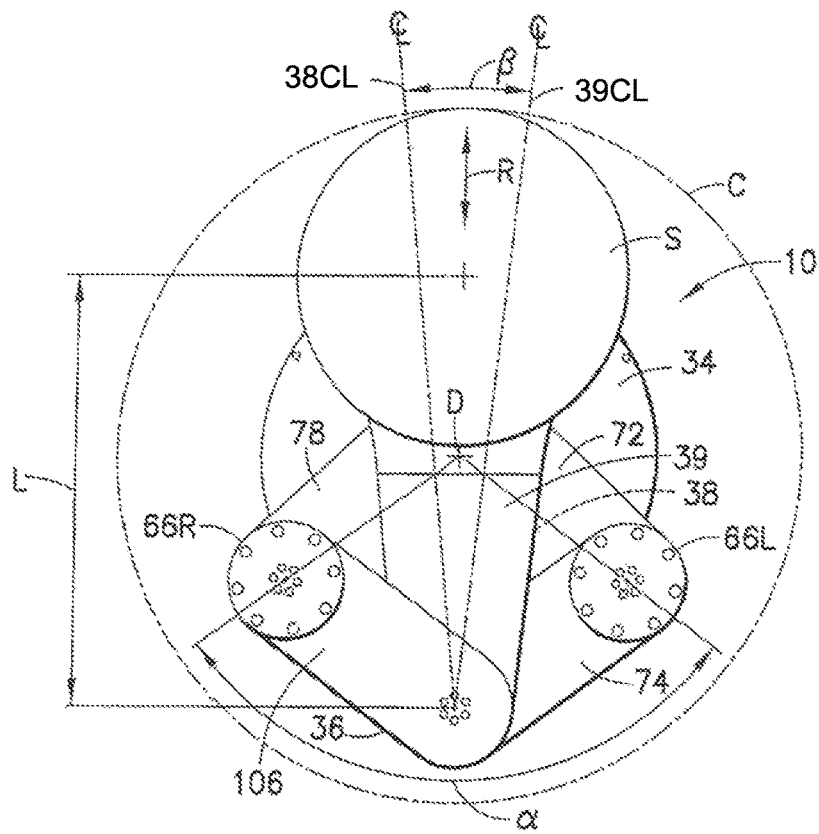
FIGS. 4-4A respectively are a main plan view of the transport apparatus and a secondary plan view of the upper arm of the transport apparatus (the forearms and end effectors in this view being omitted for clarity) and showing a footprint of the transport apparatus with the upper arm of the apparatus placed in a first configuration.
Figure 5:
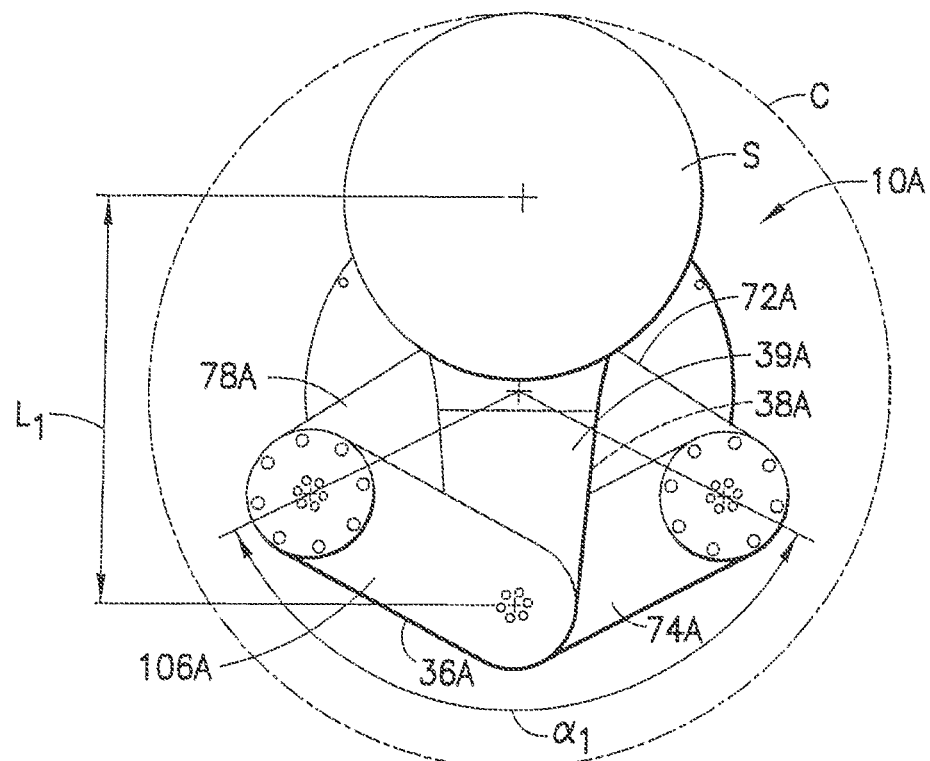
FIGS. 5-5A respectively are a another main plan view of the transport apparatus and another secondary plan view of the upper arm of the transport apparatus (the forearms and end effectors in this view again being omitted for clarity) with the upper arm of the apparatus placed in another configuration.
Figure 6:
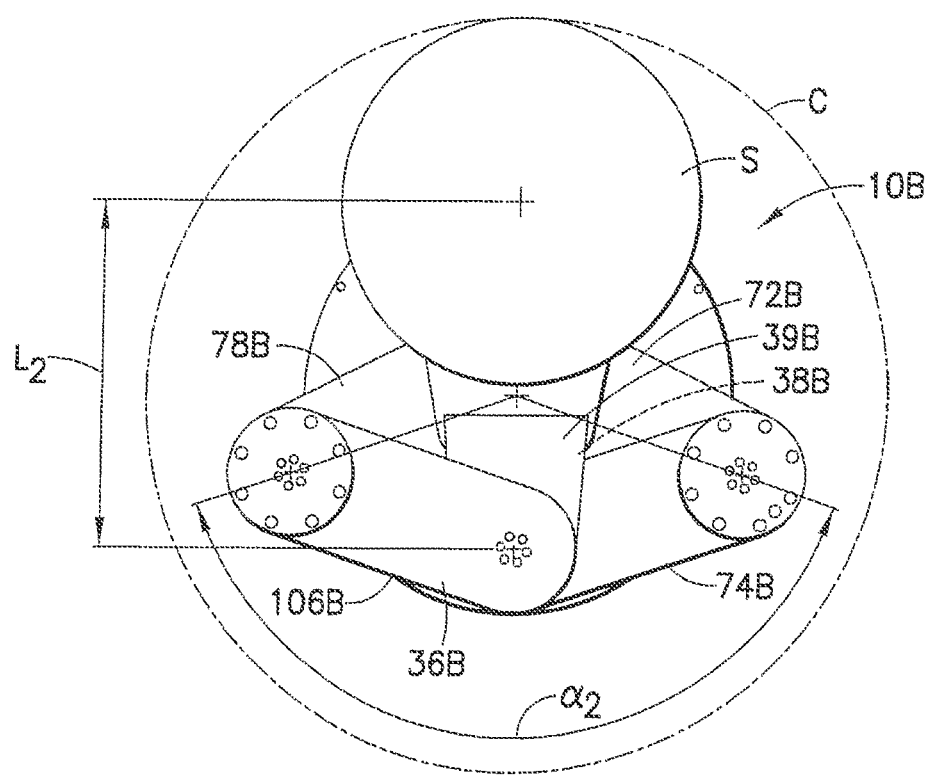
FIGS. 6-6A respectively are a yet another main plan view of the transport apparatus and yet another secondary plan view of the upper arm of the transport apparatus (the forearms and end effectors in this view yet again being omitted for clarity) with the upper arm of the apparatus placed in yet another configuration.

The apparatus 10 may be provided with end effectors of different lengths in order to tailor the reach of the apparatus as desired. FIGS. 4-6, are plan views respectively showing the arm assembly 36, 36A, 36B of the apparatus 10 with different length end effectors 38, 38A, 38B, 39, 39A, 39B. As may be realized, the reach of the apparatus may be increased or reduced to accommodate the different depths, and in particular substrate pick/release positions, that may exist in the various processing or holding modules (not shown) communicating with the transport chamber P (see FIG. 1). For example, in the case where a module of longer length is connected to the chamber P the end effector has to reach further out (through an opening) of the chamber to position or pick a substrate therefrom. Conversely, in the case where a shorter length module is connected to the chamber, the apparatus 10 may have a shorter reach to pick or place substrates therein. An effective way to provide the apparatus with the desired reach is to use an end effector with a length corresponding to the desired reach. Hence for a longer reach, the arm assembly 36 would have longer end effectors, and for shorter reach the arm assembly would have shorter end effectors. The arm assembly 36 of the apparatus shown in FIG. 4 has the longer end effectors 38, 39 compared to the end effectors 38A, 39A and 38B, 39B (that are progressively shorter) correspondingly shown in FIGS. 5-6 (i.e. L is greater than L1 which is greater than L2).

As may be realized, having a longer length end effector in conventional transport apparatus result in an increase in the overall footprint. Further, as may be realized, the transfer chamber P of a processing tool may be manufactured long before a selection is made as to the type and hence size of modules that will be communicating with the particular transfer chamber P. Accordingly, the transfer chamber P for conventional systems is sized to accommodate the largest anticipated footprint of the transport apparatus (i.e. the one with the longest possible end effectors). Further, with the transfer chamber built in advance (to suit maximum apparatus footprint), conventional apparatus with shorter end effectors may not receive the benefit of the shorter end effectors because the conventional apparatus are positioned in the transfer chamber in the same position as if the apparatus had longer end effectors. With the shorter end effectors of the conventional apparatus now positioned further from the modules, the swap times are lengthened.

By comparison as seen from FIGS. 4-6, having end effectors 38, 38A, 38B 39, 39A, 39B of different lengths on the arm assembly 36 in this exemplary embodiment, the footprint of the apparatus may be minimized for the longest desired reach and still maintain minimum sway times independent of the reach of the transport apparatus. Moreover, the apparatus 10 can provide optimum footprint to extension ratios. The overall footprint of the apparatus 10, 10A, 10B (each having end effectors 28, 39, 38A, 39A, 38B, 39B of different length) is identified in FIGS. 4-6 by circumferential perimeter C. To define the footprint perimeter of the apparatus 10, 10A, 10B, the common axis of rotation D at the arm assembly shown has been located at substantially the center point, and the footprint perimeter is established at the minimum radius from the center providing a perimeter that just encompasses all points of the apparatus 10, 10A, 10B and substrates S transported thereon. As may be realized from FIGS. 4-6, apparatus 10 (shown in FIGS. 4-4A) has the longest end effectors 38, 39 (the end effector length L is defined for example purposes as extending from pivot and at the wrist joint to the center of the substrate when positioned on the end effector) and hence the longest reach. The minimum possible footprint perimeter C is established to encompass apparatus 10, having the longest desired reach, with substrate S thereon. As can be seen from FIGS. 4-6, the footprint perimeter C is the same size for each apparatus 10, 10A, 10B. Hence, footprint perimeter C for the apparatus 10B with the shortest length (L2) end effectors 38B, 39B shown in FIG. 6 is the same size as the minimum footprint C for apparatus 10 with the longest length (L) end effectors 38, 39 shown in FIG. 4. It is noted, that the arm assembly 36, 36A, 36B of the apparatus 10, 10A, 10B respectively shown in FIGS. 4-6 is disposed in the register or initial position of the arm assembly. The initial position is the position from which the arm assembly is extended and to which the arm assembly is retracted during substrate transfer. In this embodiment, the initial position of the arm assembly is being defined for example purposes as the position where both the opposing sections 72, 78, (as well as 72A, 78A in FIGS. 5 and 72B, 78B in FIG. 6) of the upper arm 66, and the forearms 74, 106 (as well as 74A, 106A and 74B, 106B) are symmetrically positioned relative to the radial axis of motion R of the end effector. In alternate embodiments any other position may be selected as initial. As seen in FIGS. 4-6, with the arm assembly in the register position the end effectors 38, 39, 38A, 39A, 38B, 39B of each apparatus may nevertheless be positioned so that the edge of the substrates held by the end effectors 38, 39, 38A, 39A, 39A, 39B regardless of length is at the footprint perimeter C of the apparatus. Hence, the register position of the substrates S (i.e. the position of the substrates S when the arm assembly 36 is in the register position) held by the apparatus is independent of the length of the end effectors.

As illustrated in FIGS. 4-6, in effect, the arm assembly 36 of the apparatus 10 decouples the relationship between substrate register position, and the apparatus footprint C, as well as the end effector length. Accordingly, a minimum footprint may be provided to the apparatus 10 for a maximum desired end effector length, and the register position of the substrates S, and of the end effectors when not holding substrates, may be optimally selected independent of the end effector length. In turn, these features of the apparatus 10 according to the exemplary embodiment, have a direct benefit on the design and function of the workstation that cannot be provided by conventional transport apparatus. For example, the transfer chamber P may be configured to accommodate the minimum footprint of the apparatus 10 to accommodate the longest expected end effector lengths. Further, the optimal location of the end effector, regardless of its length, with the arm assembly in the register position, (i.e. maintaining the end effector so that a substrate S thereon contacts perimeter C) effectively closes undesired spaces between the register position of the end effector, or substrate thereon, and the extended position of the end effector, thereby avoiding incurring a travel distance penalty for the smaller length end effectors as in conventional apparatus. Accordingly, minimum swap times are always achieved for the minimum apparatus footprint.

Figure 4A:
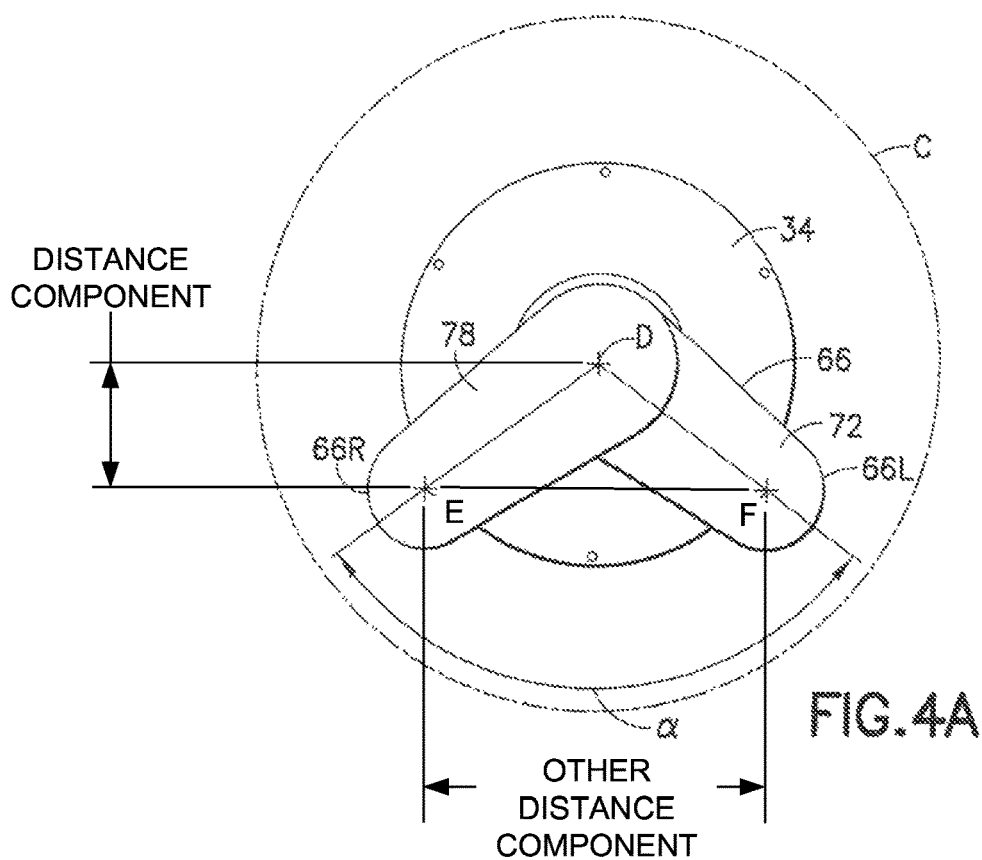
Figure 5A:
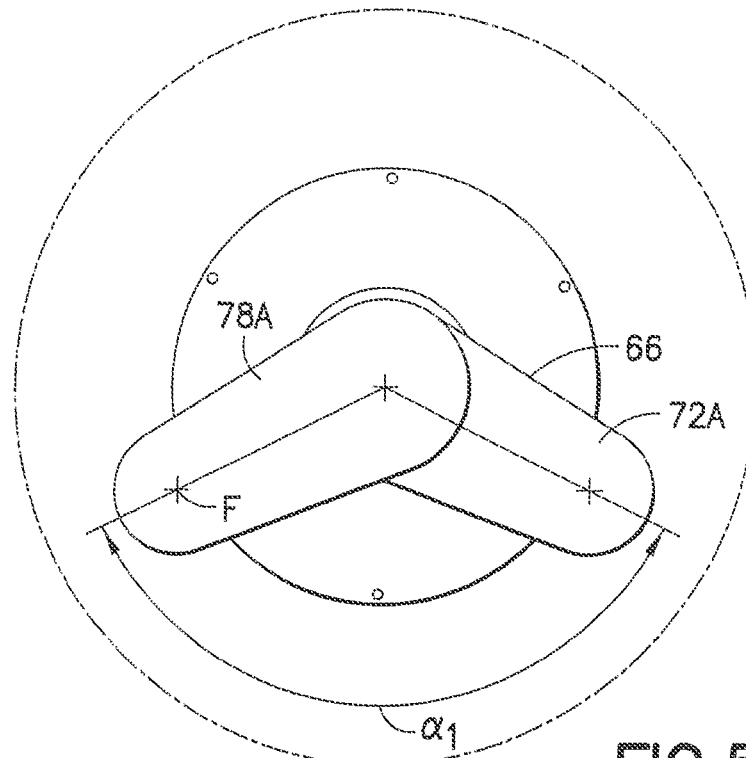
Figure 6A:
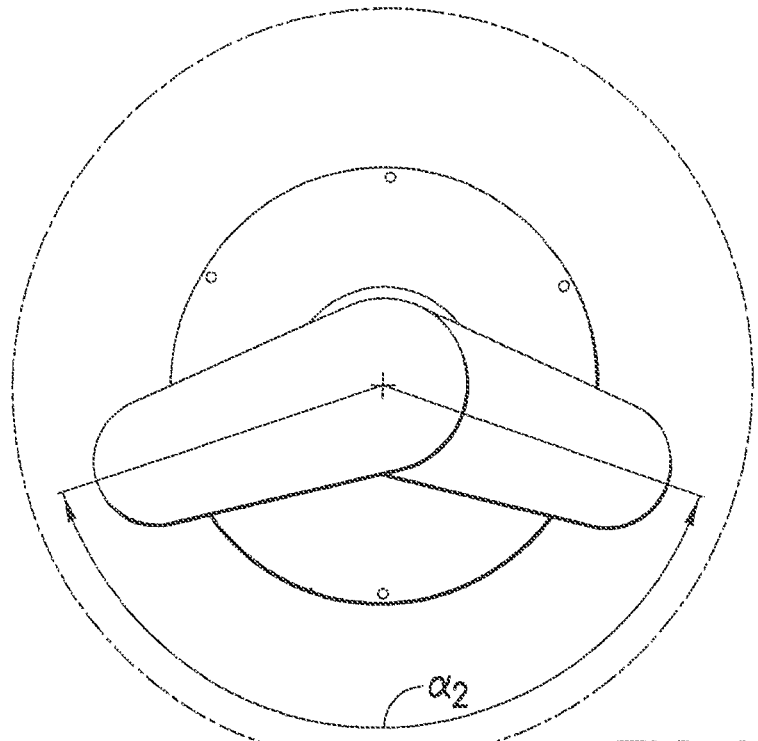

Adjustment of the apparatus footprint, and optimal positioning of the end effector is effected as illustrated in FIGS. 4A, 5A and 6A by adjusting the relative angular positions of the opposing sections 72, 78 of the adjustable upper arm 66. FIGS. 4A, 5A and 6A respectively show the sections 72, 78; 72A, 78A; 72B, 78B of the upper arm in three different positions corresponding to the different length end effectors 38, 39; 38A, 39A; 38B, 39B shown on the prior assembly in FIGS. 4-6. Thus, in FIG. 4A the upper arm section 72, 78 are positioned to form an inclusive angle α in FIG. 5A the arm section 72A, 79A form inclusive angle α1, and in FIG. 6A the arm sections 72B, 78B form inclusive angle α2. Angle α2 is more shallow than angle α1 which in turn is more shallow than angle α (e.g., where a distance component, disposed along an extension and retraction path of a respective end effector, of the distance between the common axis of rotation and at least one of the first elbow axis and the second elbow axis is changed; and another distance component transverse to the extension and retraction path of a respective end effector is changed—see FIG. 4A). Thus, as seen in FIGS. 4-6 and 4A-6A, the size of the inclusive angle between the upper arm sections is decreased as the length (L, L, L2) of the end effectors 38B, 39B; 38A, 39A; 38, 39 is increased. As the inclusive angle between the opposing upper arm sections is decreased, the arms sections are rotated further back (opposite the direction of extension), when the arm assembly is in the registered position. This in turn moves the forearms 74B, 104B; 74A, 104A; 74, 104 back when registered, and thereby moves the end effectors back allowing the longer length end effectors to remain within the minimum footprint of the apparatus. To move the opposing sections 72, 78 of the arm assembly, the bolts 75 (see FIG. 3) locking the arm sections together, (or other locking device) are released. This allows one or both arm section 72, 78 to be pivoted relative to each other about axis of rotation D until the desired inclusive angle α, α1, α2 is achieved between the arm sections. The lock bolts 75 are then reintroduced thereby again locking the arm sections to each other in the new position. After repositioning the upper arm 66, that in turn repositions the forearms and end effectors carried by the upper arm, the controller 11 is programmed to set the register position of the drive motors 42, 44, 46 (see FIG. 2). Teaching/programming transfer movements of the transport apparatus 10 may then be accomplished in the conventional manner except as otherwise noted below.

Extension and retraction of the arm assembly 36 may be effected in the following manner for example. To extend end effector 39, the upper arm 66 is rotated clockwise about axis D by motor 44 (driving the outer shaft 50B). The forearm 106 supporting end effector 39 is rotated counter clockwise, by motor 46 driving inner shaft 50C and transmission 116, about axis E. The synchronizer 124 anchored to the upper arm maintains the end effector 39 linearly aligned with radial axis of motion R as the end effector is being advanced by the upper arm. During transport operations it may be desired to maintain the other end effector(s) 38, 39 retracted when one end effector is being extended. Accordingly, for example, if end effector 39 is being extended end effector 38 may be retracted. To retract end effector 38, when end effector 39 is being extended, the forearm 74 is also rotated counter clockwise by driving motor 42 driving mid-shaft 50A and transmission 84, about axis F. The motor 42 moves the forearm 74, relative to the pivoting upper arm 66, to maintain the retracted position of the forearm 74 as shown in FIGS. 4-6. The synchronizer 98 anchoring the end effector 38 to the upper arm maintains the end effector 38 aligned with the radial axis R of extension/retraction. Retraction of the extended end effector is accomplished in the opposite manner to extension. During retraction of extended end effector 39, the end effector 38 is maintained, at least temporarily, in the retracted position by reverse rotations (e.g. clockwise about axis F). To continue extending motion, such as during a substrate swap, of the previously retracted end effector 38, the upper arm 66 rotation (i.e. counter clockwise, commenced to retract the previously extended effector 39) is maintained past the register position, waive rotation of forearms 38 (i.e. clockwise to extend) and 39 (i.e. clockwise to retract and remain retracted during extension of opposing forearm) is continued until the desired positions are reached.

As noted before, the register position of the arm assembly 68 has been defined, for purposes of description of this embodiment, as being the position of the arm assembly when the forearms 74, 106 and upper arm sections 72, 78 are symmetrically arranged relative to the radial axis R along which the end effectors 38, 39 are extended/retracted (though as noted before the register position may be selected as any other desired position). It may be realized from FIG. 2, that due to the synchronizers 98, 124 respectively locking the end effectors 38, 39 to the upper arm, repositioning of the upper arm sections 72, 78 to provide the desired inclusive angle α, α1, α2 (see FIGS. 4A-6A) causes the end effectors 38, 39 to be angled relative to teach other in this embodiment. This is schematically illustrated in FIG. 4 by phantom axis 38 CL and 39 CL, that are meant to show the true orientation of the center lines of the end effectors 38, 39 when the upper arm sections 72, 78 are set to form inclusive angle α shown in FIG. 4A. Setting the upper arm sections 72A, 78A; 72B, 78B further apart, as shown in FIGS. 5A-6A, rotates the center lines of the end effectors 38, 39 towards the radial axis R, reducing the angle (see FIG. 4) between the end effectors. To accommodate the angle B between the end effectors 38, 39, during swap motion of the arm assembly, an additional rotation of the upper arm may be performed to align the extending end effector with the radial axis R. For example, if end effector 39 is being extended, the upper arm 66 is rotated to align end effector center line 39 CL with radial axis R. This additional motion may be performed at any desired time prior or during extension. When retracting the end effector 39 during a swap, an additional motion of the upper arm 66 may be performed to bring the centerline 38 CL of end effector 38 into alignment with radial axis R. In alternate embodiments, an adjustment means may be provided, such as for example a release mechanism unlocking the synchronizers for the end effectors, from the upper arm. This would allow the upper arm sections to be positioned as desired while maintaining a desired alignment for the end effectors relative to radial axis R. After adjustment, the locking mechanism would be reengaged to again lock the end effectors to the upper arm.

Referring now to FIG. 7, there is shown a cross-section view of a substrate transport apparatus 110 in accordance with another exemplary embodiment. The transport apparatus 110 in this embodiment is generally similar to the apparatus 10 described before and shown in FIGS. 1-6. Accordingly, similar features between the exemplary embodiments are similarly numbered, and will be mentioned only briefly below. As with apparatus 10, there is a drive section 234 and an arm assembly 236. Arm assembly 236 has at least one upper arm 266, pivotable about axis D at the shoulder joint, and two forearms 274, 306 pivotally mounted at opposite ends of the upper arm. The upper arm 266 includes at least two sections 272, 278 with a lockable adjustable interface 273I connecting the sections to each other. The interface 273I can be locked to hold the upper arm sections in desired orientation relative to each other. When unlocked, the interface 273I allows the upper arm sections 272, 278 to be repositioned in a manner similar to that described before for upper arm 66 and shown in FIGS. 4A-6A. The structural features of the upper arm sections that form interface 273I may be similar (e.g. mating surfaces, mounting holes and mounting/locking fasteners) to the features described before with respect to arm sections 72, 78. The drive section 234 in the embodiment shown in FIG. 7, has drive motors 242, 246 that are mounted to the arm assembly 266. In the embodiment shown, the drive motors 242, 246 are mounted on the upper arm 266. Drive motor 242 powers shaft 250A that is fixedly connected to forearm 274. Rotation of shaft 250A rotates forearm 274 about axis F1 at one elbow of the arm assembly. Drive motor 246 powers shaft 250C that is fixedly connected to forearm 306. Rotation of shaft 250C rotates forearm 306 about axis E at the opposite elbow of the arm assembly. Motor 244 is located at the shoulder joint of the arm assembly. Motor 244 powers drive shaft 250B that is fixedly connected to the upper arm 266 to rotate the upper arm about axis of rotation D at the shoulder. Synchronizers 298, 324 respectively anchor the end effectors 238, 239 to the upper arm during rotation of the forearms 274, 306. Though the forearm motors 242, 244 are shown in this embodiment as being located exterior to the frames of the upper arm and corresponding forearms, in alternate embodiments the motors driving the forearms may be positioned in any other desirable manner, such as being housed within the envelope provided by the frame of the upper arm, or the frames of the forearm, or may be situated in the space between the forearm and upper arm. In still other embodiments, the forearm drive motors may be located within the frame of the upper arm, but having the drive shaft offset from the forearm axis of rotation at the elbows. Accordingly, in this case a suitable transmission, such as for example similar to transmissions 84, 116 in FIG. 2 would drivingly connect the motor output shafts with idler pulleys on the forearms. Extension and retraction of the arm assembly 266 of the apparatus 210 is accomplished in a manner substantially similar to that described before with respect to apparatus 10. The forearm motors 242, 244 may be controlled by a controller (similar to controller 11 in FIG. 1) so that forearm rotation is about 2 times rotation of the upper arm in this embodiment.

Referring again to FIG. 1, a substrate buffer 400 may be provided to the transfer chamber P. The buffer may be positioned within the chamber, or may communicate with the chamber through a suitable port allowing the transfer apparatus (and 210) to place/pick substrates from the buffer 400. The buffer 400 is located out of the working envelope of the transport arm during operation. The drive of the apparatus may be used to allow the transport to access the buffer.

Figure 8:
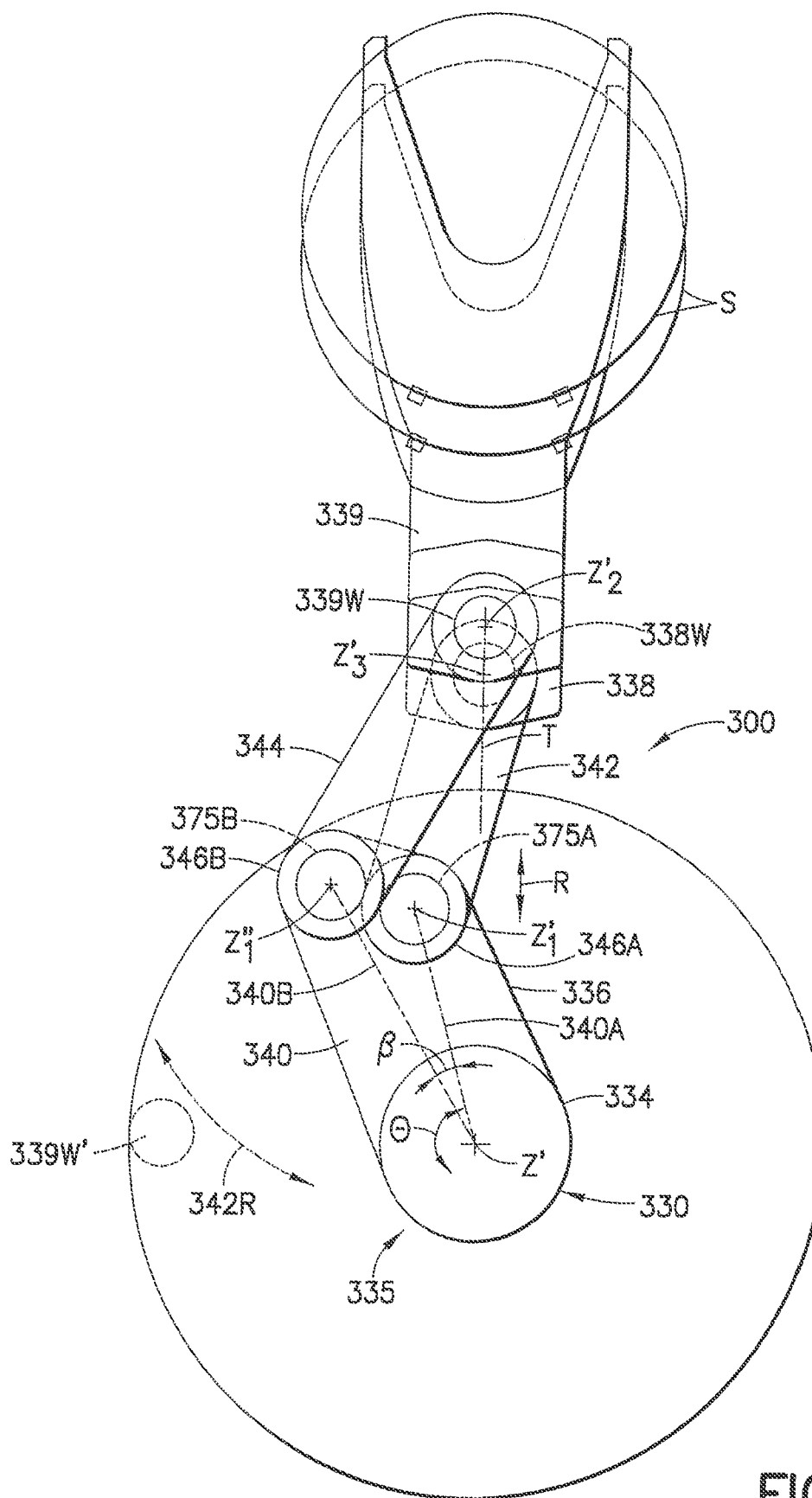
FIG. 8 is a schematic plan view of a transport apparatus in accordance with another exemplary embodiment, the apparatus being shown in an extended position.
Figure 9:
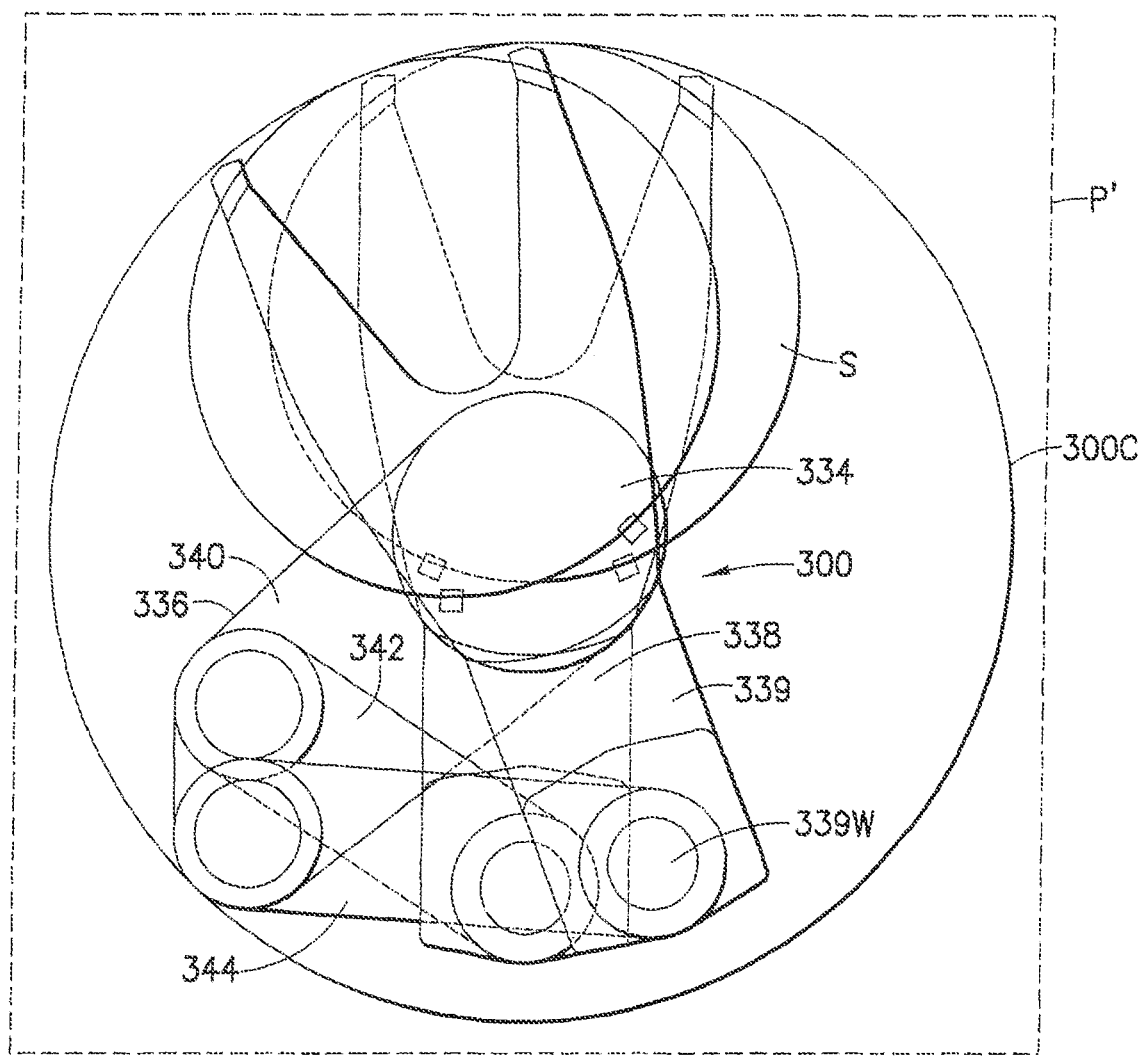
FIG. 9 is another schematic plan view of the apparatus in FIG. 8 showing the apparatus in a retracted to a register position, and showing a footprint perimeter of the retracted apparatus.

Referring now to FIGS. 8-9, there is shown a substrate transport apparatus 300 of the present disclosure incorporating features in accordance with another exemplary embodiment. FIG. 8 shows the apparatus 300 in an extended position, and FIG. 9 shows the apparatus fully retracted to its register position. The transport apparatus 300 in this exemplary embodiment is generally similar to apparatus 10 described before and similarly features are similarly numbered. Similar to apparatus 10, apparatus 300 generally comprises a drive section 330 and moveable arm assembly 336. Arm assembly 336 in the exemplary embodiment has, what shall be referred to as a general one side scara arm arrangement with two end effectors 338, 339. The arm assembly in this embodiment has an upper arm 340 and two forearms 342, 344 descending from a common end of the upper arm. The forearms 342, 344 are independently joined to the same end of the upper arm by independent elbow joints 346A, 346B as will be described below. The arm assembly 336, similar to arm assembly 360 of apparatus 10, is connected to the drive section 330 at shoulder joint 335 (see FIG. 8), to rotate (in the direction indicated by arrow in FIG. 8) about the shoulder axis of rotation Z1 and extend/retract (in the direction indicated by arrow R in FIG. 8) the end effectors 338, 339 to the pick/place locations for the substrates S. In this embodiment, the upper arm 340 defines two different effective upper arm lengths 340A, 340B and the forearms 342, 344 are of different lengths corresponding to the respective effective upper arm lengths as will be described further below. The end effectors 338, 339 carried respectively by the forearms 342, 344 may be of substantially equivalent length. The arm assembly 336 may be operated with drive 330 so that the reach with either end effector 338, 339 is substantially the same. The arm assembly 336 is also operable to provide a minimum footprint, for corresponding to the small swing diameter of the arm and independent give reach of the arm, of the larger swing diameter as will be described further below.

Referring now to FIG. 9, the transport apparatus 300 is shown located in a representative transport diameter P1 similar to transport chamber P described previously and shown in FIG. 1. The transport chamber P1 may be an atmospheric chamber, where the environment in the chamber interior communicates generally with an exterior atmosphere, or may be an isolatable chamber capable or having to interior space isolated from the exterior atmosphere. For example, the isolated chamber P1 may have an insert gas atmosphere or the interior of the chamber may maintain a vacuum. The transport apparatus 300 may be mounted or otherwise positioned in the chamber P1 in substantially the same manner as apparatus 10 in chamber P (see FIG. 1).

Figures 10, 10A:
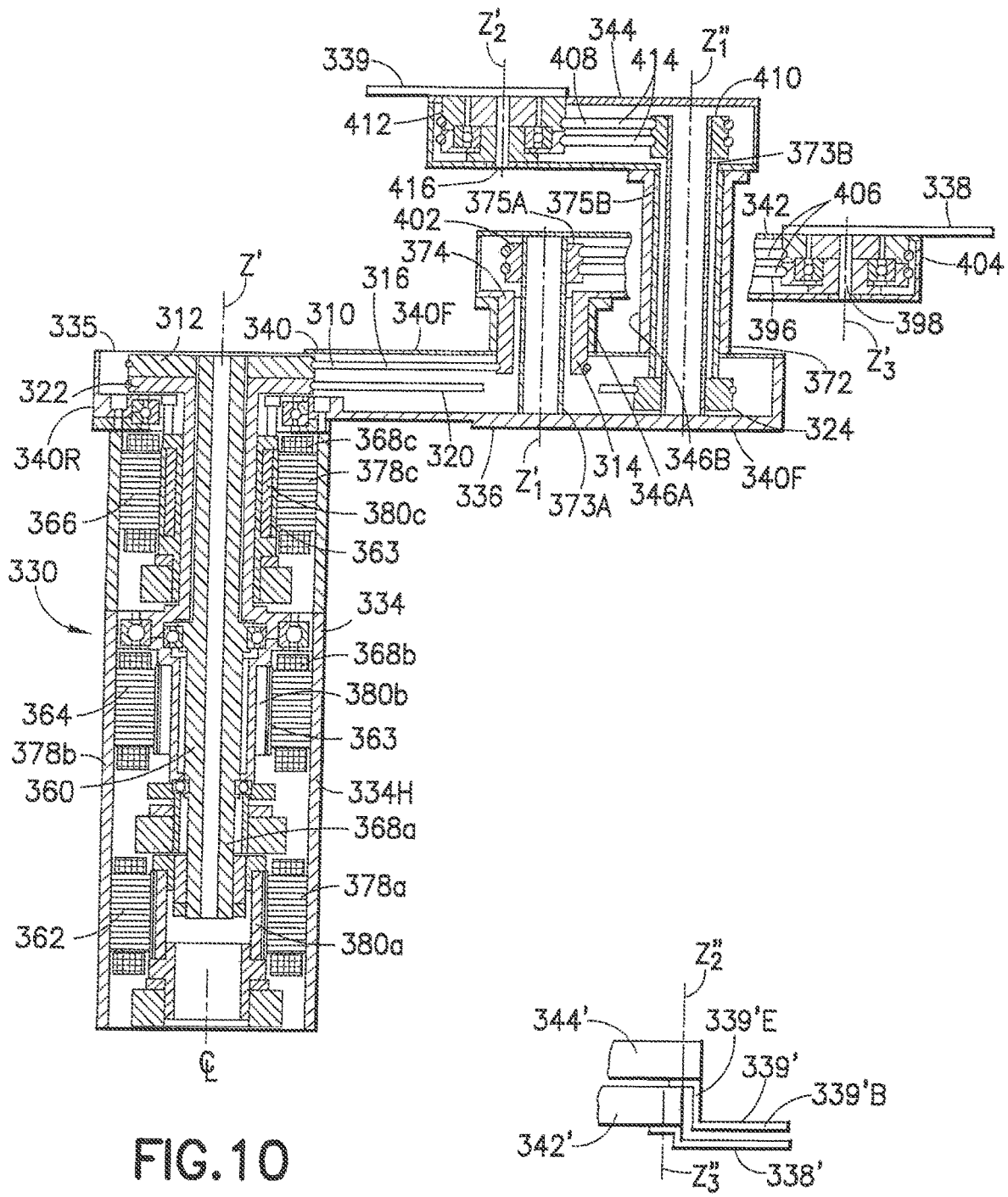
FIG. 10 is a schematic cross section view of the substrate transport apparatus in FIG. 8.
FIG. 10A is a partial schematic elevation view of one end of the substrate transport apparatus in accordance with another exemplary embodiment.

Referring now also to FIG. 10, which shows a cross-section view of the transport apparatus, drive section 334 may have an outer housing 334H that houses a co-axial shaft assembly 360, and three motors 362, 364, 366. In an alternate embodiment, the drive section could have more or fewer than three motors. The drive shaft assembly 360 has three drive shafts 368a, 368b, and 368c. In an alternate embodiment more or fewer than three drive shafts could be provided. The first motor 362 comprises a stator 378a and a rotor 380a connected to the inner shaft 368a. The second motor 364 comprises a stator 378b and a rotor 380b connected to the middle shaft 368b. The third motor 366 comprises a stator 378c and rotor 380c connected to the outer shaft 368c. The three stators 378a, 378b, 378c are stationary attached to the housing 334H at different vertical heights or locations along the housing. In this embodiment the first stator 378a is the bottom stator, the second stator 378b is the middle stator and the third stator 378c is the top stator. Each stator generally comprises an electromagnetic coil. The three shafts 368a, 368b, and 368c are arranged as coaxial shafts coaxial with shoulder axis of rotation Z. The three rotors 380a, 380b, 380c may comprise permanent magnets, but may alternatively comprise a magnetic induction rotor which does not have permanent magnets. Sleeves 363 are located between the rotor 380 and the stators 378 to allow the transport apparatus 300 to be useable in a vacuum environment with the drive shaft assembly 360 being located in a vacuum environment and the stators 378 being located outside of the vacuum environment. However, the sleeves 363 need not be provided if the (see Fig.) is only intended for use in an atmospheric environment.

The first shaft 368a is the inner shaft and extends from the bottom stator 378a. The inner shaft has the first rotor 380a aligned with the bottom stator 378a. The middle shaft 368b extends upward from the middle stator 378b. The middle shaft has the second rotor 380b aligned with the second stator 378b. The outer shaft 368c extends upward from the top stator 378c. The outer shaft has the third rotor 380c aligned with the upper stator 378c. Various bearings are provided about the shafts 368 and the housing 334H to allow each shaft to be independently rotatable relative to each other and the housing 334H. Each shaft 368 may be provided with a suitable position sensor to signal a controller similar to controller 11 (see FIG. 1) of the rotational position of the shafts 368 relative to each other and/or relative to the housing 334H. Any suitable sensor may be used, such as optical or induction.

As seen in FIG. 10, the upper arm 340 is position, using suitable bearings to allow for rotation of the upper arm about shoulder axis of rotation Z; onto the casing 334H of the drive section 334. The upper arm 340 may have a hollow frame or casing capable of housing drive transmission 320, 310 and communication lines (not shown) connecting the end effectors to suitable sources of power (not shown) and controller 11 (see FIG. 1). The frame 340F of the upper arm may be a member of unitary construction or may be an assembly as desired. As shown in FIG. 10, the upper arm frame is fixedly connected as one end 340R to the outer shaft 308C so that the shaft and upper arm 340 are rotated as a unit about axis of rotation Z at the shoulder joint 335 of the scara arm 336. In this exemplary embodiment, the upper arm 340 supports tow independent shaft assemblies 375A, 375B. Shaft assemblies 375A, 375B are located at the opposite end 340F of the upper arm frame from the shoulder end 340R. Shaft assemblies 375A, 375B each define an independent elbow joint 346A, 346B for independently mounting the respective forearms 342, 344 to the upper arm 340. Shaft assembly 375A generally comprises a rotatable outer shaft 374, stably held in suitable bearings for free rotation about axis of rotation Z; at elbow joint 346A. Shaft assembly 375A may also comprise an inner post 373, generally concentric with shaft 374, but fixed to the upper arm frame as shown in FIG. 10. Shaft assembly 375B, of elbow joint 346B, is substantially similar to assembly 375A, with an outer rotatable shaft 372 and a concentric inner post 373B fixed to the upper arm frame. The rotatable shaft 372 of elbow joint 346B is rotatable about axis of rotation Z1".

As seen best in FIG. 8, the shaft assemblies 375A, 375B are located on the upper arm 340 with a radial and angular offset. In this embodiment, shaft assembly 375A (for elbow 346A) is located radially closer to the center of the shoulder joint (defined by axis of rotation Z') than the shaft assembly 375B for elbow assembly 346B. Thus, the radial length 340A between the center of rotation of elbow joint 346A (defined by axis of rotation Z1') and the center of rotation of the upper arm (i.e. axis of rotation Z') is smaller than the corresponding radial length 340B between the center of rotation of the second elbow joint 346B (defined by axis of rotation Z1") and the center of rotation of the upper arm.

Shaft assemblies 375A, 375 are also separated by an angular offset B as shown. As seen in FIG. 8, both shaft assemblies 375A, 375B are positioned on one side of the axis of translation T (connecting wrist joints center of rotation Z2', Z3' and shoulder joint center of rotation Z' and along which the end effectors are translated in direction R). The shaft assembly 375A (or elbow joint 346A) closest to the axis of translation T has the shorter radial (length) 340A compared to the radial 340B of the outer shaft assembly 375B (or elbow joint 346B). The upper arm, may thus be considered as having two effective upper arm lengths (corresponding to radials 340A, 340B) located on one side of the axis of translation T of the end effectors. Although, in this exemplary embodiment, the frame 340F of the upper arm has been shown as being of monolithic shape to appear as but a single arm, in alternate embodiments the upper arm frame may have any other suitable shape for locating and supporting the two offset shaft assemblies on one side of the axis of translation (for example, the frame of the upper arm may be bifurcated to appear as two arms extending from the shoulder joint, similar to shoulder joint 335 to the independent elbow joints). As may be realized, the radial and angular offset may be established as desired to provide a minimum apparatus footprint, and the elbow joints 346A, 346B are shown in FIG. 8 with minimum separation.

Referring again to FIG. 10, forearm 342 is fixedly mounted to shaft 374 to rotate as a unit with shaft 374 about axis of rotation Z1' at elbow joint 346A. The second forearm 344 is fixedly mounted to shaft 372 to rotate as a unit with shaft 372 about axis of rotation Z1" at elbow joint 346B. As seen in FIG. 8, forearms 342, 344 each have different effective lengths (the effective forearm length is defined here as the distance between the center of rotation Z1', Z1" at the elbow joint 346B, 346A and the center of rotation Z'3, Z'2 at the wrist joint 338W, 339W corresponding to the forearm 342, 344). In this embodiment, forearm 342 is shorter than forearm 344. As may be realized from FIG. 8, the effective length of each forearm 342, 344 is commensurate to the radial length 340A, 340B to the corresponding elbow joint 346A, 346B joining the given forearm to the upper arm 340. Hence, in this embodiment the effective length of the forearm 342 at elbow joint 346A is substantially equivalent to radial length 340A. Similarly, forearm 344 at elbow joint 346B has an effective length substantially equal to the radial length 340B. One forearm 344 is staggered vertically from the other to allow both arms to be pivoted freely about the respective axis of rotation Z1', Z1" without interference with each other. In this embodiment, the outer and longer forearm 344 is located above the inner shorter forearm 342. Sufficient standoff may be provided at shaft assembly 375B, to provide the upper arm 344 with sufficient clearance relative to the lower arm 342.

Figure 12:
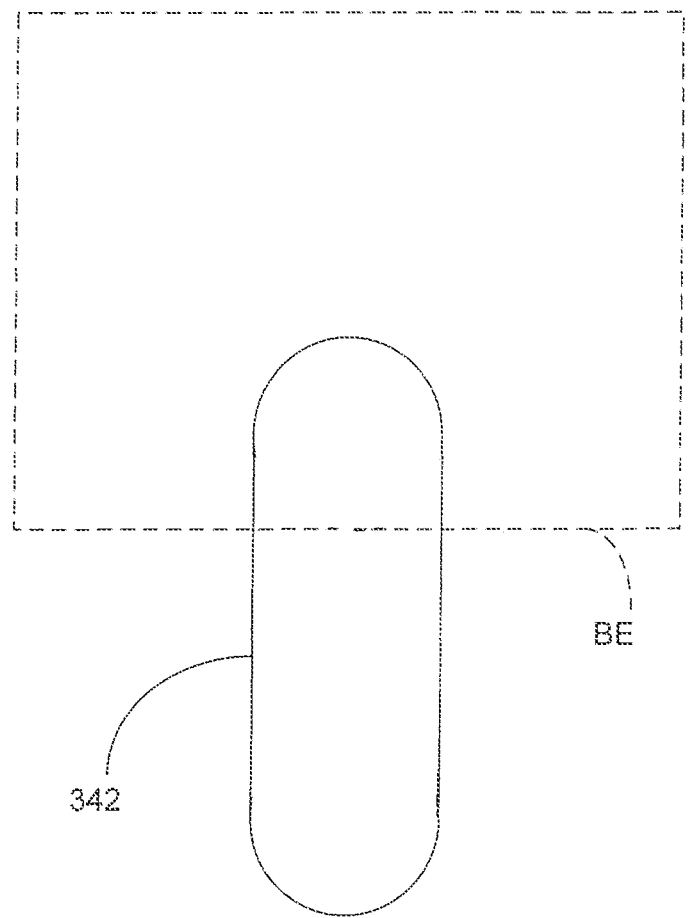
FIG. 12 is a schematic view of a portion of a transport apparatus in accordance with an exemplary embodiment.

Still referring to FIG. 8, each forearm 342, 344 carries an end effector 338, 339 capable of rotating about corresponding axis of rotation Z3', Z2' relative to the forearm supporting it. In this embodiment, the end effectors 338, 339 may have the same effector length, though in alternate embodiments, different length end effectors may be used. In other alternate embodiments one or more of the end effectors may have a batch holding capability (such as by having a row of multiple substrate supports, see batch end effector BE in FIG. 12). In this embodiment, the transport provided with each end effector 338, 339 is substantially the same. Rotation of each forearm 342, 344 is independently powered by corresponding drive shafts 368A, 368B of the drive section 334.

As seen in FIG. 10, in this embodiment the middle shaft 368b is connected to transmission to 320 in the upper arm 340, and the inner shaft 368a is connected to transmission 210 in the upper arm. The first transmission 320 in this embodiment may comprise a drive pulley 322, an idler pulley 324 and drive cables or belts 326. In alternate embodiments, any suitable transmission may be used. The drive pulley 322 is fixedly mounted to the top of the middle shaft 368b and is connected by drive belt 326 to the idler pulley 324. The idler pulley 324 is fixedly mounted to shaft 372 of shaft assembly 375B connecting the forearm to the upper arm. The second transmission 310 in the upper arm link 340 may comprise a drive pulley 312, an idler pulley 314, and drive belt or cables 316. Drive pulley 312 is fixedly mounted to the top of inner shaft 368a of coaxial shaft assembly 360 in drive section 334. The idler pulley 314 is fixedly mounted to shaft 374 of shaft assembly 375A connecting the forearm 342 to the upper arm 340. Drive belt 316 connects the drive pulley 312 to the idler pulley 314. The reduction ratio between the idler and the drive pulleys 314, 312 of the second transmission 310, and between the idler and drive pulleys 324, 322 of the first transmission 320 in this embodiment is about 1:2, though in alternate embodiments the ratio between the idler and drive pulleys may be as desired. The drive belts 316, 326 are configured to rotate the respective idler pulleys 314, 304 in the same direction as the corresponding drive pulley 312, 322 (e.g. clockwise rotation of drive pulleys 320, 322 causes clockwise rotation of idler pulley 314, 322).

Rotation of the end effectors 338, 339 about the corresponding axis of rotation Z3', Z2' is slaved to the upper arm 340 by synchronizers 396, 408 shown in FIG. 10.

Forearm synchronizer 396 may be located within the forearm 342, and may comprise drum 402, idler pulley 404, and connecting cable(s) or belt(s) 406. Drum 402 is fixedly mounted to the stationary post 373A (fixed to upper arm 340). Idler pulley 404 is fixedly mounted to shaft 398 pivotally connecting the end effector 338 to the forearm 342. Belt(s) 406 connects the drum 402 to the idler 404 and are preferably configured to have a general loop shape (not shown) so that rotation of the forearm link 342 about axis Z1' causes counter-rotation of the idler 404 about axis Z3'. Drum 402 on fixed post 373A diameter to idler pulley 404, diameter ratio may be about 1:2. The aforementioned ratios of forearm synchronizer 396 and of the second transmission 310 (see FIG. 10) causes the end effector 338 to maintain a substantially straight line motion along traverse axis T (see FIG. 8). Forearm synchronizing mechanism 408 is located in forearm 344, and comprises drum 410, idler 412, and connecting cable(s) or belt(s) 414. The driver 410 is fixedly mounted to the top of fixed post 373B. Idler 412 is fixedly mounted to shaft 416 which pivotally connects the end effector 339 to forearm link 344. Cable(s) 414 connect the drum 410 to idler 412 and are preferably configured in a general loop shape (not shown), so that rotation of the forearm link 344 about axis Z1" causes counter-rotation idler 412 about axis Z2'. The diameter ratio between idler 412 and drum 410 of synchronizer 408 may be about 2:1. These ratios in combination with the reduction ratio of the first transmission 320 in the upper arm 340 causes the end effector 339 to traverse in a substantially straight line along traverse axis T when the scara arm 236 is extended or retracted.

As seen in FIG. 10, in this embodiment the end effectors 338, 339 are respectively mounted on the corresponding forearms 342, 344 to be adjacent to the upper surfaces of the forearm. This allows both forearms to pass through a vacuum slot valve (not shown) of the transport chamber P (see FIG. 8). In alternate embodiments, the end effectors may be mounted to the respective forearms to be located between the upper and lower forearms in a manner similar to end effectors 38, 39 shown in FIGS. 1-2. FIG. 10A shows the end effectors mounted on the forearms in a configuration in accordance with yet another exemplary embodiment. The end effectors 338', 339' and forearms 342', 344' in this embodiment, except as described otherwise are substantially similar to the end effector and forearms of apparatus 300 described before and shown in FIGS. 8-10, and similar features are similarly numbered. End effectors 338', 339' are mounted, as shown in FIG. 10A, to the bottoms of the corresponding forearms 342', 344'. End effector 339', may have an extension portion 339'E as shown, allowing the horizontal blade 339'B of end effector 339' (carried by upper forearm 344') to be positioned in close vertical proximity to the end effector 338' (carried by the lower forearm 342'). As may be realized from FIGS. 8 and 10A, the differential length of the forearms 342, 3444, 342', 344' in this embodiment allow the apparatus 300 to execute a first swap movement without mounting one of the end effectors on a conventional bridge in order to allow the end effectors and forearms to move past one another during swap motion. In this embodiment, the different length forearms 342, 344, 342', 344' and offset of the elbow joints 346A, 346B, where the forearms are respectively rotated, suffice to enable the forearms and corresponding end effectors 338, 339, 338', 339 to move freely past one another during swap movement as will be described further below.

Extension and retraction of arm assembly 336 may be effected in a similar manner to that described before with respect to arm assembly 36 shown in FIGS. 1-2. To extend end effector 338 (for example from its register position shown in FIG. 9), the upper arm 340 is rotated clockwise about axis Z' (by drive shaft 368C see FIG. 10). The forearm 342, supporting end effector 338 is rotated counter clockwise about axis Z1' (by drive shaft 368A), and synchronizer 396 maintains the end effector 338 aligned true to the axis of translation T (see FIG. 8). The second forearm 344, and corresponding end effector 339, forearm 344 may remain in its retracted position (see FIG. 9) relative to the upper arm. Referring to FIG. 8, reference 339W' indicates the location of the end effector wrist 339W with the end effector 339 in its retracted position and when the upper is moved so that end effector 338 is extended. To retract end effector 338, the forearm 342 may be rotated now clockwise about axis Z1'. Line 342R represents the path of the outermost portion of the forearm 342 as it is rotated about axis Z1' towards its retracted position, while the upper arm 340 remains in its extended position in preparation for extending end effector 339. As seen in FIG. 8, and also in FIG. 9, the forearm 342 moving end effector 338 to its retracted position, clears the wrist 339W of end effector 339 allowing the forearms and corresponding end effectors to move freely past each other to effect the swap movement without a bridge for the end effector. End effector 339 is extended and retracted by rotating the forearm 3434 respectively counterclockwise and clockwise about axis Z1" with drive shaft 368B (see FIG. 10). As seen in FIG. 9, the longer forearm 344 is under rotated (compared to the shorter forearm 342) during retraction, and hence extension, so that the register position of end effector 339 is located to minimize the footprint of apparatus 300.

Figure 11:
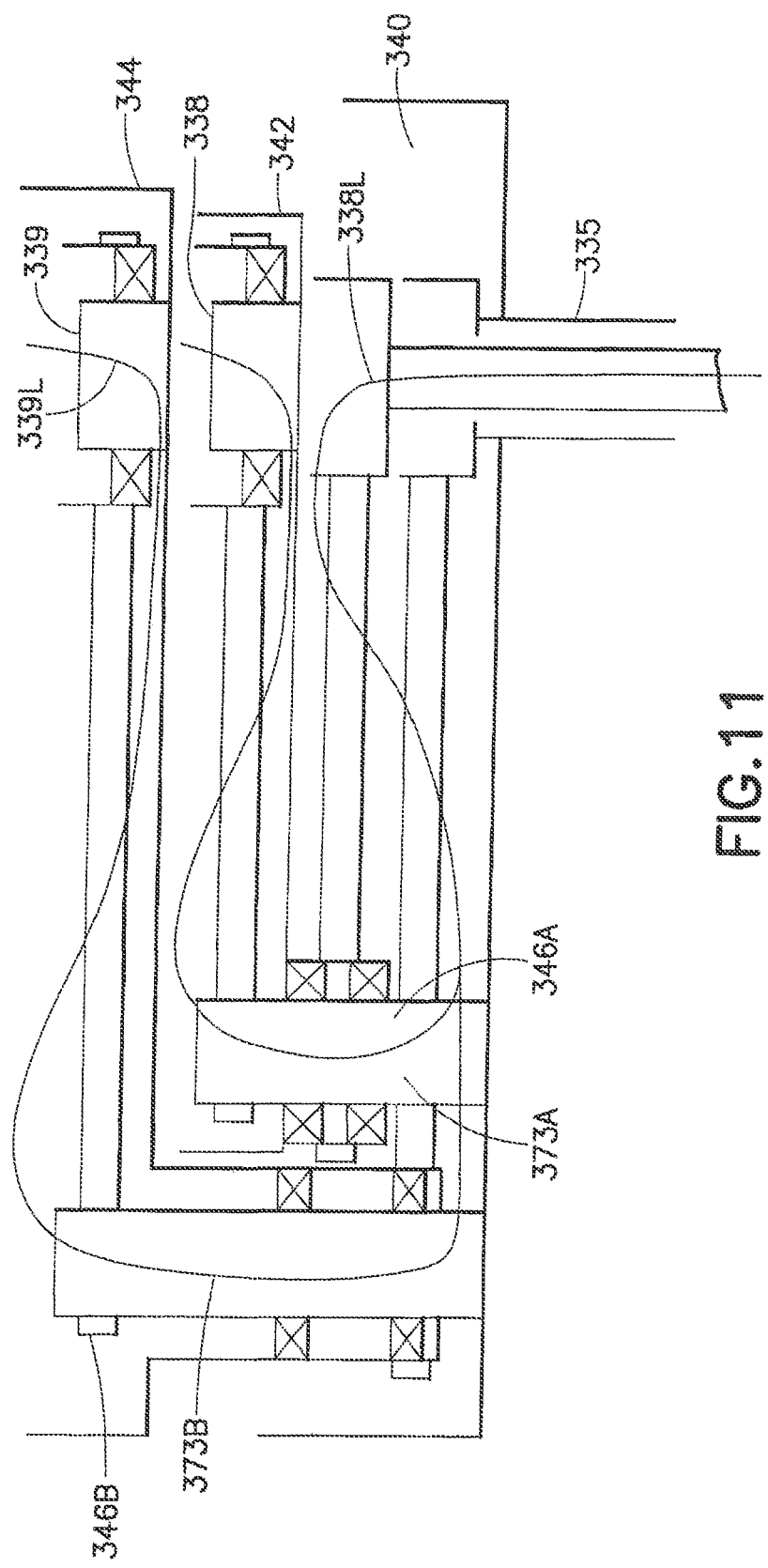
FIG. 11 is a partial cross sectional view of the upper arm and forearms of the substrate transport apparatus in accordance with still another exemplary embodiment.

Transport apparatus 300 has a simplified bearing and communication line feed through compared with conventional transport apparatus with multiple forearms mounted on a common (concentric) elbow joint. FIG. 11 illustrates an example of the feed arrangement of communication lines 338L, 339L, respectively fed to end effectors 338, 339, through the upper arm 340, elbow joints 346A, 346B and forearms 342, 344 of transport apparatus 300. The feed arrangement shown eliminates the need for a vacuum lip seal and slip rings between forearms. This results in a simpler arm with less wear components that is more reliable and easier to fabricate than conventional device.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method of transporting a substrate comprising:
providing a drive section of a substrate transport apparatus;
providing a transport arm section connected to the drive section and being configured to transport substrates to a module, the transport arm section including:
a substantially rigid upper arm having a first upper arm section and a second upper arm section coupled to each other at a common axis of rotation by a releasable coupling to form the substantially rigid upper arm having opposite ends,
a first forearm rotatably coupled to a first one of the opposite ends at a first elbow axis,
a second forearm rotatable coupled to a second one of the opposite ends at a second elbow axis, and
at least one end effector connected to each of the first forearm and the second forearm, each end effector being configured to hold at least one substrate;
positioning the first elbow axis and the second elbow axis at a distance from the common axis of rotation; and
changing, with the releasable coupling, a distance component, disposed along an extension and retraction path of a respective end effector, of the distance between the common axis of rotation and at least one of the first elbow axis and the second elbow axis based on a predetermined characteristic of the module.

2. The method of claim 1, further comprising effecting, with a controller connected to the drive section, adjustment of each end effector along the extension and retraction path, relative to a substrate holding location of the module, depending on a position of the first upper arm section relative to the second upper arm section.

3. The method of claim 2, further comprising rotating the substantially rigid upper arm, with the controller, to effect the adjustment of each end effector along the extension and retraction path.

4. The method of claim 1, wherein a position of each end effector relative to the module depends on a distance between the respective elbow axis of the first upper arm section and the second upper arm section.

5. The method of claim 1, wherein the releasable coupling defines the common axis of rotation.

6. The method of claim 1, wherein the drive section defines an axis of rotation substantially collinear with the common axis of rotation, the substantially rigid upper arm being mounted to the drive section to rotate relative to the drive section about the common axis of rotation.

7. The method of claim 1, wherein the first upper arm section and the second upper arm section extend on opposite sides of the common axis of rotation.

8. The method of claim 1, further comprising identifying a variance, with a controller, and changing another distance between a respective elbow axis of the first upper arm section and second upper arm section to effect adjustment of each end effector along the extension and retraction path.

9. The method of claim 1, wherein the extension and retraction path of respective end effectors extends on opposite sides of the common axis of rotation.

10. A method of transporting a substrate comprising:
providing a drive section of a substrate transport apparatus;
providing a transport arm section connected to the drive section and being configured to transport substrates to a module, the transport arm section including:
a substantially rigid upper arm having a first upper arm section and a second upper arm section coupled to each other at a common axis of rotation by a releasable coupling to form the substantially rigid upper arm having opposite ends,
a first forearm rotatably coupled to a first one of the opposite ends at a first elbow axis,
a second forearm rotatable coupled to a second one of the opposite ends at a second elbow axis, and
at least one end effector connected to each of the first forearm and the second forearm, each end effector being configured to hold at least one substrate; and
changing, with the releasable coupling, an orientation of an axis of extension of one of the at least one end effector, to the module, based on a predetermined characteristic of the module.

11. The method of claim 10, further comprising effecting, with a controller connected to the drive section, adjustment of the one of the at least one end effector along the axis of extension, relative to a substrate holding location of the module, depending on a position of the first upper arm section relative to the second upper arm section.

12. The method of claim 11, further comprising rotating the substantially rigid upper arm, with the controller, to effect the adjustment of the one of the at least one end effector along the axis of extension.

13. The method of claim 10, wherein a position of each end effector relative to the module depends on a distance between the respective elbow axis of the first upper arm section and the second upper arm section.

14. The method of claim 10, wherein the drive section defines an axis of rotation substantially collinear with the common axis of rotation, the substantially rigid upper arm being mounted to the drive section to rotate relative to the drive section about the common axis of rotation.

15. The method of claim 10, wherein the first upper arm section and the second upper arm section extend on opposite sides of the common axis of rotation.

16. The method of claim 10, wherein the releasable coupling defines the common axis of rotation.

17. The method of claim 10, further comprising identifying a variance, with a controller, and changing another distance component between a respective elbow axis of the first upper arm section and second upper arm section to effect adjustment of each end effector along the extension and retraction path.

18. The method of claim 10, wherein the extension and retraction path of respective end effectors extends on opposite sides of the common axis of rotation.

* * * * *